(12) United States Patent
Okada et al.

(10) Patent No.: US 6,359,949 B1
(45) Date of Patent: *Mar. 19, 2002

(54) DEMODULATION CIRCUIT, A DECODE CIRCUIT AND A DIGITAL PLL CIRCUIT FOR AN OPTICAL DISC APPARATUS

(75) Inventors: Isao Okada; Tsuyoshi Hirabuki, both of Chofu (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/620,054

(22) Filed: Jul. 20, 2000

Related U.S. Application Data

(62) Division of application No. 09/084,359, filed on May 22, 1998, now Pat. No. 6,175,542.

(30) Foreign Application Priority Data

| | | |
|---|---|---|
| May 29, 1997 | (JP) | .............................. 9-140457 |
| Jun. 23, 1997 | (JP) | .............................. 9-165954 |
| Jun. 26, 1997 | (JP) | .............................. 9-170075 |

(51) Int. Cl.[7] .............................................. H04L 23/00
(52) U.S. Cl. .................. 375/376; 369/47.19; 369/47.28; 329/325
(58) Field of Search ............................. 369/47.5, 47.28, 369/53.34, 53.35, 53.2; 365/47.19; 375/376; 329/325

(56) References Cited

U.S. PATENT DOCUMENTS

| | | | | |
|---|---|---|---|---|
| 4,668,917 A | * | 5/1987 | Levine | .......................... 328/133 |
| 4,780,772 A | * | 10/1988 | Shibuha et al. | ................ 360/51 |
| 4,982,110 A | * | 1/1991 | Yokogaawa et al. | ......... 307/269 |
| 5,271,040 A | * | 12/1993 | Clark | ............................ 375/81 |

(List continued on next page.)

FOREIGN PATENT DOCUMENTS

| | | | |
|---|---|---|---|
| EP | 0805438 | | 5/1997 |
| EP | 0805438 A2 | * | 11/1997 |
| JP | 63-302626 | * | 12/1988 |
| JP | 06-104740 | * | 4/1994 |
| JP | 08077715 | * | 3/1996 |
| JP | 8077715 | | 3/1996 |
| JP | 08-172353 | * | 7/1996 |
| JP | 8214033 | | 8/1996 |
| JP | 08214033 | * | 8/1996 |

OTHER PUBLICATIONS

Europ. Search Report 98304217, search report only.*

Primary Examiner—Aristotelis M Psitos
(74) Attorney, Agent, or Firm—Ladas & Parry

(57) ABSTRACT

An optical disc apparatus has a demodulation circuit performing an FSK demodulation by being provided with a binary signal which is obtained by binarizing a signal reproduced from an optical disc on which an FSK modulation signal is previously recorded. An edge interval of the binary signal is measured. An FSK modulation component is obtained from a difference between a measured edge interval value and a previously determined edge interval reference value. A demodulation value is obtained based on a moving average of the FSK modulation component. A moving average of the demodulation value is compared with a reference value so as to obtain a binary FSK demodulation signal. Additionally, the optical disc apparatus includes a decode circuit for decoding binary data from a biphase code signal which is reproduced from an optical disc and to be inverted at an end of each bit. When an inversion of the biphase code signal is not performed at an end of a bit, the decode circuit corrects the binary data immediately before or after the end of the bit. Further, the optical disc apparatus includes a digital PLL circuit which divides a frequency of a demodulated signal reproduced from the optical disc by a predetermined dividing ratio. A clock signal is obtained based on an edge interval value of the divided modulated signal.

2 Claims, 21 Drawing Sheets

U.S. PATENT DOCUMENTS

| | | | |
|---|---|---|---|
| 5,335,215 A | * | 8/1994 | Yoshiyama |
| 5,363,360 A | * | 11/1994 | Fairchild |
| 5,506,824 A | * | 4/1996 | Fairchild et al. .............. 369/48 |
| 5,528,573 A | * | 6/1996 | Shim |
| 5,528,574 A | * | 6/1996 | Takeuchi et al. .............. 369/50 |
| 5,606,466 A | * | 2/1997 | Fisher et al. .................. 360/51 |
| 5,703,851 A | * | 12/1997 | Ando .......................... 369/47 |
| 5,946,279 A | * | 8/1999 | Okada et al. ................. 369/50 |

* cited by examiner

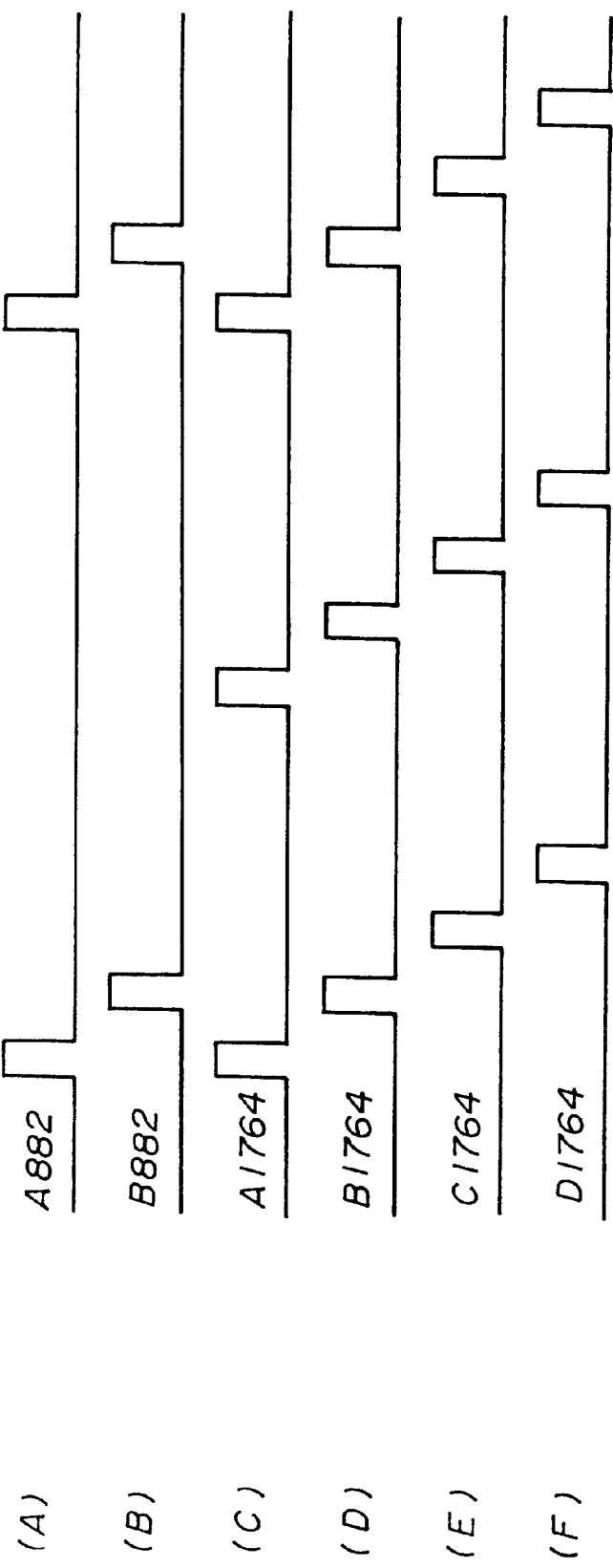

FIG. 20

| SWP | FF1 | FF2 | FF3 | ALGORITHM | CORRECTION BIT |
|---|---|---|---|---|---|
| 1 | 0 | 0 | 1 | UNCONDITIONAL | CURRENT CYCLE |
| | 1 | 1 | 0 | UNCONDITIONAL | CURRENT CYCLE |
| | 1 | 1 | 1 | EXOR OF EC01 AND EC02 = 1 | OLD CYCLE |
| | 0 | 0 | 0 | EXOR OF EC11 AND EC12 = 1 | OLD CYCLE |
| | 1 | 1 | 1 | EXOR OF EC01 AND EC02 = 0 | CORRENT CYCLE |
| | 0 | 0 | 0 | EXOR OF EC11 AND EC12 = 0 | CORRENT CYCLE |

DEMODULATION CIRCUIT, A DECODE CIRCUIT AND A DIGITAL PLL CIRCUIT FOR AN OPTICAL DISC APPARATUS

REFERENCE TO RELATED INVENTION

This application is a division of U.S. Ser. No. 09/084,359, filed on May 22, 1998, now U.S. Pat. No. 6,175,542, issued on Jan. 6, 2001, which U.S. Patent is hereby incorporated herein by reference.

BACKGROUND OF THE INVENTION

1. Field of the Invention

The present invention relates to a demodulation circuit of an optical disc apparatus and, more particularly, to a demodulation circuit which performs an FSK demodulation on a reproduced signal of an optical disc apparatus which reproduces information recorded on a recordable optical disc.

Additionally, the present invention relates to a decode circuit of an optical disc apparatus and, more particularly, to a decode circuit which decodes a reproduced. BIDATA signal to obtain ATIP data in an optical disc apparatus which regenerates information recorded on a recordable optical disc.

The present invention also relates to a digital PLL circuit which generates a clock signal synchronous with pulses having a predetermined pulse width included in an input signal.

2. Description of the Related Art

Conventionally, there is a recordable compact disc system (CD-R) which uses a recordable optical disc. The CD-R system records synchronization information and address information as a wobble signal for controlling rotation of the disc by forming wobbling or meandering grooves on the CD-R.

The wobble signal is a signal which is FSK modulated by a modulation signal BIDATA of a biphase code which is information regarding addresses on a disc. When the disc is rotated at a specified linear velocity, a WBL frequency $f_{WBL}$ is 22.05±1 KHz. The ATIP signal includes a synchronization signal ($ATIP_{SYC}$) which is information regarding the addresses, addresses and an error detection code CRC. The frequency of the synchronization signal is 75 Hz.

FIG.1 shows an example of a demodulation circuit which obtains the modulation signal BIDATA by FSK demodulating the wobble signal reproduced from an optical disc.

In FIG.1, a wobble signal input to a terminal 1 is supplied to a phase comparator 2, and the wobble signal is subjected to a phase comparison with an output signal of a VCO (voltage-controlled oscillator) 3. The phase error signal obtained by the phase comparator 2 is supplied to a low-pass filter (LPF) 4 so as to eliminate an unnecessary high-frequency component therefrom. The filtered phase error signal is output from a terminal 5 as an FSK demodulation signal, and also is supplied to a multiplier 6. The signal is multiplied by a loop gain K by the multiplier 6, and is supplied to the VCO 14.

In an analog circuit, when an entire circuit is integrated into a single semiconductor device, it is difficult to accurately set circuit element constants. Thus, circuit elements requiring accuracy must be externally mounted, resulting in a problem in that integration is difficult.

Additionally, a digital circuit may be used to enable integration of the circuit. In this case, the wobble signal is binarized so as to generate a WBL signal, and an edge interval of the thus obtained WBL signal is measured so as to perform an FSK demodulation. However, a quality of the wobble signal may be influenced by a quality of a reproducing circuit. Especially if a noise influencing the phase of the wobble signal enters, there is a problem in that the quality of the demodulation signal is deteriorated.

Conventionally, the signal BIDATA is supplied to a PLL circuit so as to generate a PLL clock. A decode circuit latches the signal BIDATA by an edge of the PLL signal so as to decode the ATIP data.

However, when an S/N ratio of the wobble signal is decreased or if there is a defect on the optical disc, the position of the edge of the signal BIDATA is influenced and is fluctuated. In such a case, an error may be generated in the ATIP data which is latched by the edge of the PLL clock. Such an error can be detected by an error detection code CRC provided in the ATIP data, but the error cannot be corrected. Thus, there is a problem in that quality of the ATIP information is deteriorated.

FIG. 2 is a block diagram of an example of a conventional analog PLL (phase-locked loop) circuit. In the figure, an input signal including a predetermined frequency component is input to a terminal 10, and is supplied to a phase comparator 11. The phase comparator 11 performs a phase comparison on the input signal and a signal having a predetermined frequency supplied by a frequency divider 14 so as to generate a phase error signal. The phase error signal is supplied to a VCO (voltage-controlled oscillator) 13 via an LPF (low-pass filter) 12. An oscillation signal output by the VCO 13 is divided by a frequency divider 14 into a predetermined frequency component, and is output from a terminal 15 and also supplied to the phase comparator 11. Thereby, the VCO 13 generates an oscillation signal which is synchronous with the predetermined frequency component of the input signal, and the thus-obtained signal is output from the terminal 15.

FIG. 3-(A) shows the signal BIDATA obtained by FSK-demodulating the WBL signal reproduced from a disc. The signal BIDATA is supplied to the PLL circuit shown in FIG. 2 so as to generate a clock signal shown in FIG. 3-(B). In the signal BIDATA, the repeated pulses having widths 1T and 2T represent addresses and CRC codes. The synchronization signal is represented by a pattern of pulses having widths 3T, 1T, 1T, 3T so as to differentiate the synchronization signal from the addresses and the CRC codes. It should be noted that, in the present specification, the width of the pulses refers to a duration of a high-level period or a low-level period.

The phase comparator 11 compares the phase of edges of the signal BIDATA and the clock signal shown in FIG. 3-(A) and (B). Thus, the 75-Hz component of the synchronization signal enters the phase error signal, and the 75-Hz component cannot be eliminated by the LPF 12. Thus, there is a problem in that a stability of the clock signal is deteriorated.

In order to solve the above-mentioned problem, the applicant suggested in Japanese Laid-Open Patent Application No.8-109655 a digital PLL circuit which comprises means for measuring an interval of edges of an input signal and means for generating a clock signal based on the interval of edges.

In the circuit suggested by the applicant, a width of a pulse (an interval of edges) of the signal BIDATA is measured by counting the system clock. It is determined whether the pulse width of the signal BIDATA corresponds to 1T, 2T or 3T by comparing the count value of threshold values of the pulse widths 1T and 2T with a counted value of the system clock. When the pulse width corresponds to 1T, the count value itself is selected; when the pulse width corresponds 2T, one half of the count value is selected; and when the pulse width corresponds to 3T, the immediately preceding count value is selected. The clock signal is generated based on the thus-selected count values. Accordingly, there is a problem in that a circuit scale is increased since a comparison circuit and a selection circuit for each of the widths 1T and 2T are used.

Additionally, in the optical disc apparatus, a spindle servo control is performed based on the clock signal generated in the above-mentioned digital PLL circuit so as to obtain a constant linear velocity of the optical disc. However, the clock signal cannot follow a rotation of the optical disc during a pull-in operation in which the linear velocity is not constant or during a track jump in which an optical pickup is moved in a radial direction of the optical disc since fixed values are used for the threshold values of the pulse widths 1T and 2T. Thus, there is a problem in that a stable spindle servo cannot be achieved.

SUMMARY OF THE INVENTION

It is a general object of the present invention to provide an improved and useful demodulation circuit, decode circuit and digital PLL circuit for an optical disc apparatus in which the above-mentioned problems are eliminated.

A more specific object of the present invention is to provide a demodulation circuit of an optical disc apparatus which resists a noise included in a reproduced FSK modulation signal, in which a demodulation signal having a high resolution of edges can be obtained with a simple circuit structure.

Another object of the present invention is to provide a decode circuit of an optical disc apparatus which reduces an error rate of CRC check code by correcting an error generated in binary data decoded from a biphase code signal, the error being caused by a noise.

A further object of the present invention is to provided a digital PLL circuit of an optical disc apparatus which reduces a circuit scale and generates a stable clock signal which enables a stable servo control.

In order to achieve the above-mentioned objects, there is provided according to one aspect of the present invention, a demodulation circuit of an optical disc apparatus performing an FSK demodulation by being provided with a binary signal which is obtained by binarizing a signal reproduced from an optical disc on which an FSK modulation signal is previously recorded, the demodulation circuit comprising:

edge interval measuring means for measuring an edge interval of the binary signal;

subtracting means for obtaining an FSK modulation component from a difference between a measured edge interval value and a previously determined edge interval reference value;

first moving average means for obtaining a moving average of the FSK modulation component;

demodulation value calculating means for obtaining a demodulation value based on an average value output from the first moving average means;

second moving average means for obtaining a moving average of the demodulation value; and comparing means for comparing an average value output from the second moving average means with a reference value so as to obtain a binary FSK demodulation signal.

Accordingly, a noise entering the modulation component can be greatly reduced by obtaining the moving average of the modulation component which is FSK demodulated. Additionally, a high-resolution of edges of the demodulation signal is obtained by obtaining the moving average of the demodulation value, resulting in a simple circuit structure.

There is provided according to another aspect of the present invention a decode circuit of an optical disc apparatus for decoding binary data from a biphase code signal which is reproduced from an optical disc and to be inverted at an end of each bit, the decode circuit comprising:

correction signal generating means for generating, when an inversion of said biphase code signal is not performed at an end of a bit, a correction signal for correcting the binary data immediately before or after the end of the bit; and data correcting means for correcting the decoded binary data by using the correction signal.

Accordingly, since the binary data immediately before or after the end of the bit is corrected when the biphase code signal is not inverted at the end of the bit, an error generated in the binary data due to an influence of a noise is corrected. Thus, an error rate of the binary data can be reduced.

Additionally, there is provided according to another aspect of the present invention a digital PLL circuit of an optical disc apparatus, comprising:

frequency dividing means for dividing a frequency of a signal to be demodulated reproduced from an optical disc by a predetermined dividing ratio;

measuring means for measuring an edge interval of an output signal of the frequency dividing means; and clock generating means for generating and outputting a clock signal based on an edge interval value obtained by the measuring means.

Accordingly, since the edge interval is measured by dividing the frequency of the modulated signal, a conventional circuit such as a comparing circuit or a selecting circuit is not needed, resulting in a great reduction in the circuit scale. Additionally, since the generated clock signal has a frequency responsive to the rotational speed of the optical disc, a stable servo control can be performed by using the clock signal even when a pull-in operation or a track jump is performed.

The above mentioned digital PLL circuit may further comprise phase correction means for correcting the edge interval value measured by the measuring means by detecting a phase error from a measurement value of the measuring means obtained at a timing of a clock signal generated by the clock generating means.

Accordingly, the clock signal can be controlled so as to match not only the frequency of the frequency divided signal of the reproduced modulated signal but also the phase of the frequency divided signal.

Other objects, features and advantages of the present invention will become more apparent from the following detailed description when read in conjunction with the accompanying drawings.

BRIEF DESCRIPTION OF THE DRAWINGS

FIG. 11 is a timing chart for explaining timing signals in the present invention;

FIG. 20 is an illustration for explaining a correction algorithm of the second embodiment;

DETAILED DESCRIPTION OF THE PREFERRED EMBODIMENTS

A description will now be given of a first embodiment of the present invention.

Figure 4:
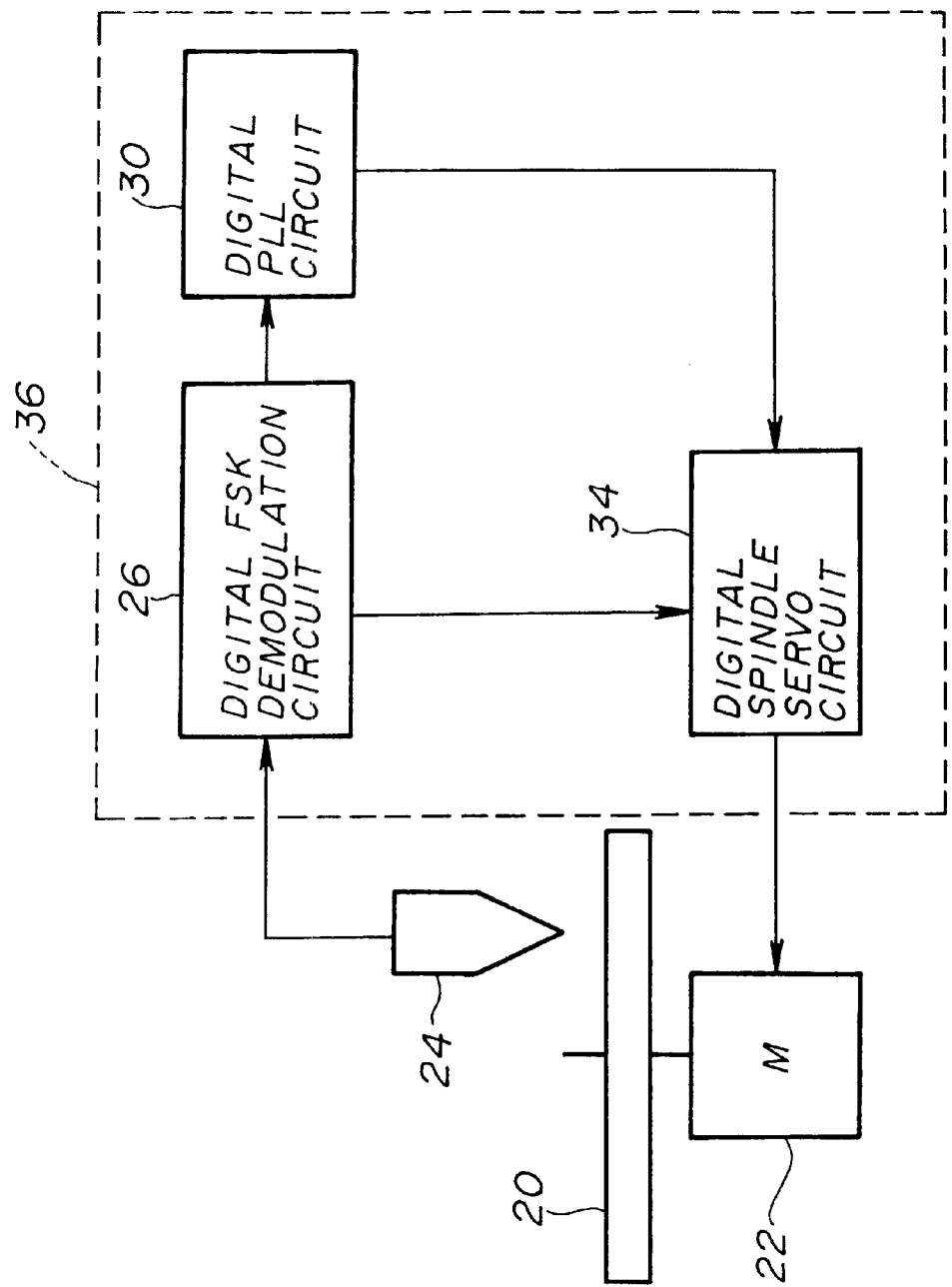
FIG. 4 is a block diagram of an optical disc apparatus according to a first embodiment of the present invention.

FIG. 4 is a block diagram of an optical disc apparatus according to the first embodiment of the present invention. In the figure, an optical disc 20 is rotated by a spindle motor 22. An optical pickup 24 reproduces a wobble signal shown in FIG. 5-(B) from the disc 20, and binarizes the wobble signal so as to output a WBL signal shown in FIG. 5-(C). It should be noted that FIG. 5-(A) shows a modulation signal BIDATA which is used for producing the wobble signal.

Figure 5:
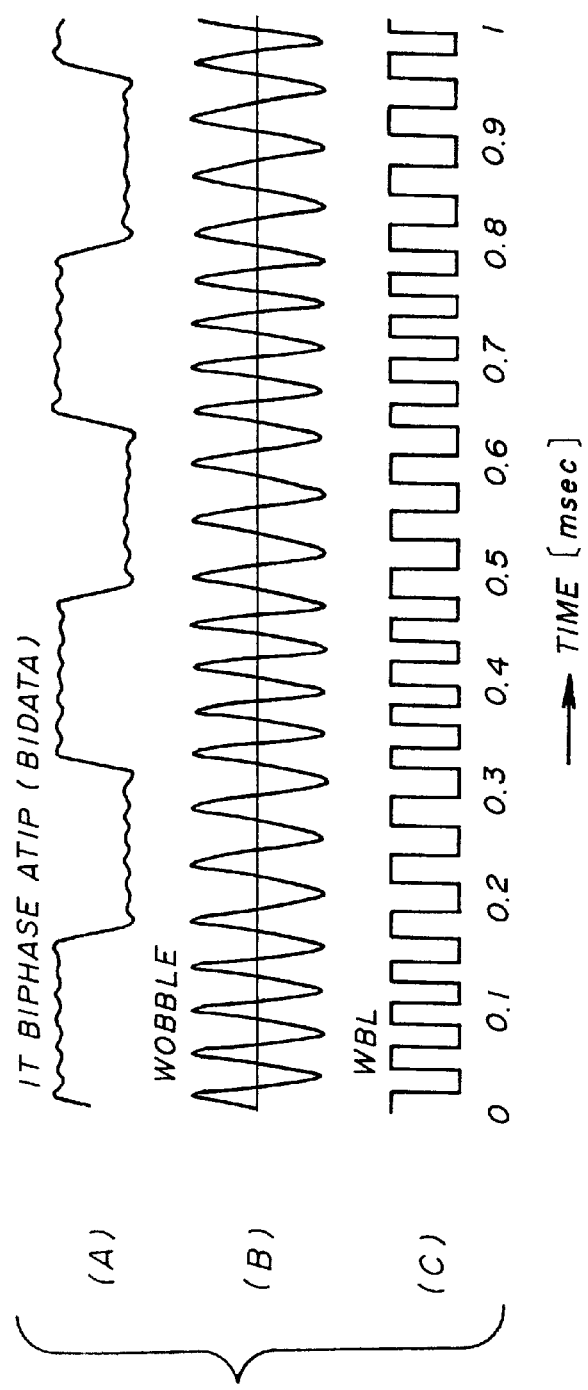
FIG. 5 is waveform charts of signals related to the present invention.

The above-mentioned WBL signal is supplied to a digital FSK demodulation circuit 26 so that a modulation signal similar to that shown in FIG. 5-(A) is obtained and a synchronization signal ($ATIP_{SYC}$) is detected. A digital PLL circuit 30 produces a signal by frequency-dividing the WBL signal supplied by the digital FSK demodulation circuit 26 by 3.5. The digital PLL circuit 30 also produces a clock signal which is synchronous with edges of the signal BIDATA. The signals produced by the digital PLL circuit 30 are supplied to a digital spindle servo circuit 34. The digital spindle servo circuit 34 controls rotation of the spindle motor based on the clock signal and the synchronization signal supplied by the digital FSK demodulation circuit 26 so that the linear velocity of the optical disc 20 is maintained constant.

All the digital FSK demodulation circuit 26, the digital PLL circuit 30 and the digital spindle servo circuit 34 perform digital processing, and are integrated into a semiconductor chip 36.

Figure 6:
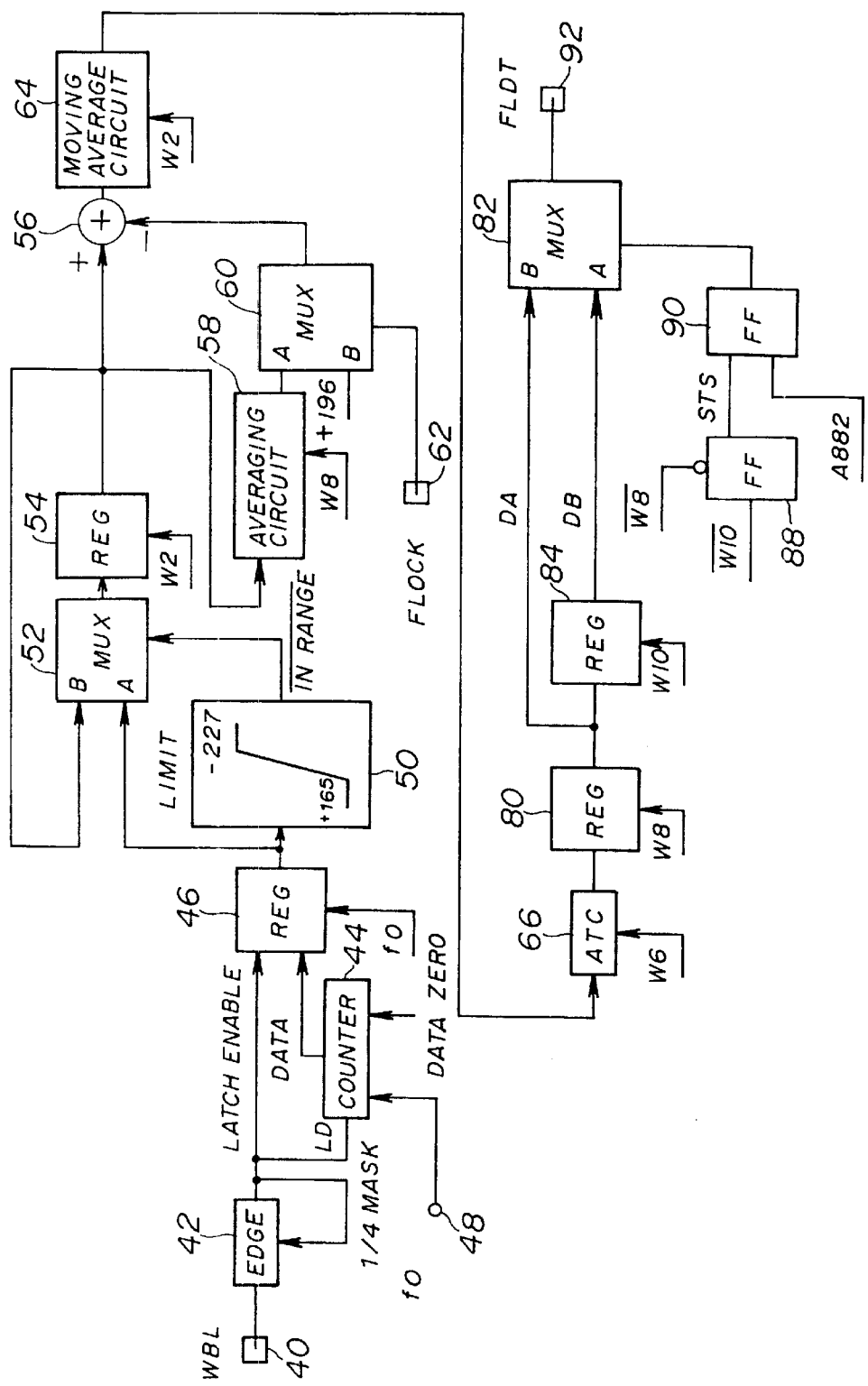
FIG. 6 is a block diagram of a part of a digital FSK demodulation circuit shown in FIG. 4.
Figure 7:
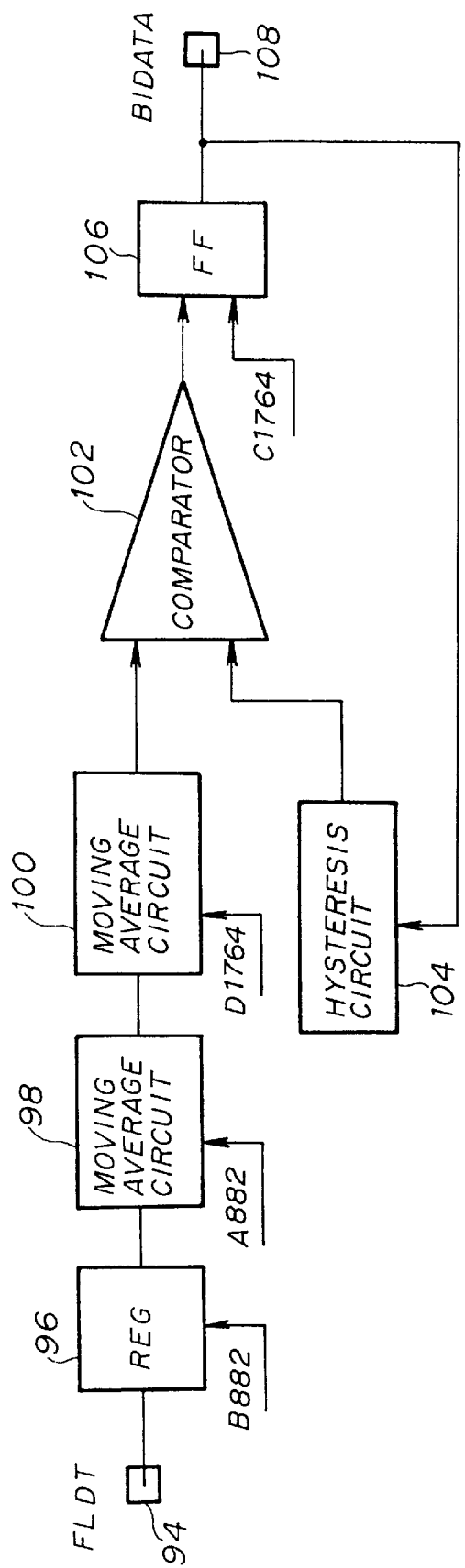
FIG. 7 is a block diagram of a part of the digital FSK demodulation circuit 26 shown in FIG. 4.

FIGS. 6 and 7 show block diagrams of an example of the digital FSK demodulation circuit 26. In FIG. 6, the WBL signal shown in FIG. 5-(C) is input to a terminal 40, and is supplied to an edge detector 42. The WBL signal is for a standard operation speed, and has a frequency of 22.05 KHz. The edge detector 42 detects a rising edge of the WBL signal and supplies it to a counter 44 and a register 46. It should be noted that the edge detector 42 is supplied with an output signal generated by itself. When a rising edge is detected within a ¼ synchronization cycle of the WBL signal after the output signal is supplied, the rising edge is recognized as a noise, and the detection of a rising edge is not output.

The counter 44 as an edge interval measuring means loads "0" when the edge detection signal is supplied. Thereafter, the counter 44 counts a system clock supplied to a terminal 48. The system clock has a frequency of 4.3218 KHz when the operation speed is a standard speed. A count value of the counter 44 is 196±α (α is a shift by a FSK demodulation, and is about a few tens), and is supplied to the register 46.

The register 46 stores the count value of the counter 44 when the rising edge detection signal is received, and supplies the count value to a comparator 50 and a terminal A of a multiplexer (MUX) 52. The comparator determines whether the count value falls within a range from 165 to 227. If the count value falls within the range, the comparator generates a control signal having a value "0" and supplies the control signal to the multiplexer 52. If the count value is out of the range, the comparator generates the control signal having a value "1" and supplies the control signal to the multiplexer 52.

A "B" terminal of the multiplexer 52 is provided with an immediately preceding count value from a register 54. The multiplexer 52 selects the present count value output from the register 46 and supplies the present count value to the register 54 when the control signal supplied by the comparator 50 has a value "0", that is, when the count value of the counter 44 is within the range from 165 to 227 and there is no possibility for an error. The multiplexer 52 selects the immediately preceding count value output from the register 54 and supplies the immediately preceding count value to the register 54 when the control signal supplied by the comparator 50 has a value "1" and there is a high possibility for an error.

Figure 8:
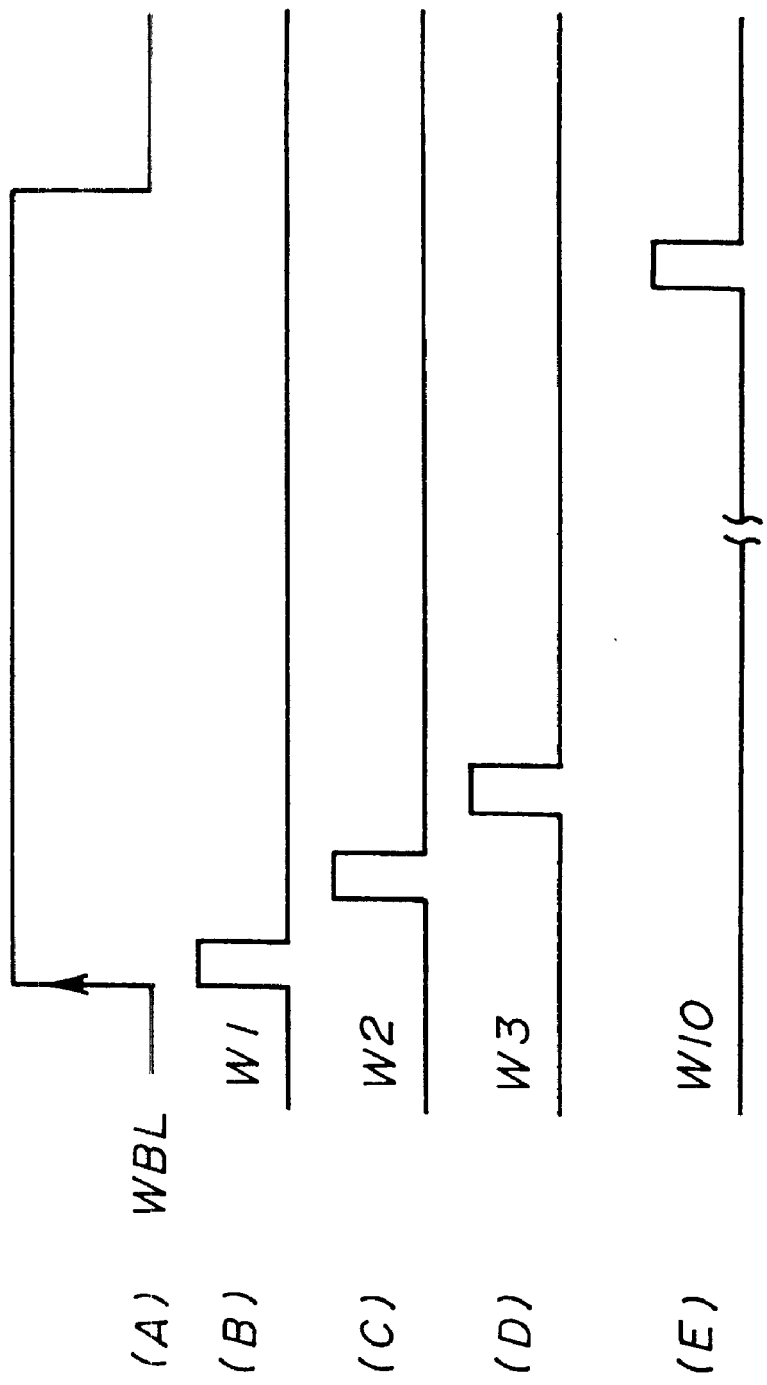
FIG. 8 is a timing chart of timing signals.

The register 54 stores a count value supplied by the multiplexer 52 when a timing signal W2 is input. A description will now be given, with reference to FIG. 8, of the timing signal W2. Timing signals W1 to W10 shown in FIG. 8-(B) to (E) are generated by a timing circuit (not shown in the figure) in synchronization with the WBL signal shown in FIG. 8-(A). A rising timing of each of the timing signals W1 to W10 is gradually shifted from a rising timing of a previous one of the timing signals W1 to W10 in that order.

The count value output from the register 54 is supplied to a subtracter 56 and an averaging circuit 58. The averaging circuit 58 averages 128 values of the count value supplied by the register 54 at an input timing of the timing signal W8, and the average value is supplied to an A terminal of a multiplexer 60. The multiplexer 60 is provided with a fixed value 196 at a B terminal thereof. The multiplexer 60 is also provided with a control signal FLOCK at a terminal 62. The multiplexer 60 selects an output of the averaging circuit 58 and supplies it to the subtracter 56 as an edge interval reference value when the control signal FLOCK is a value "1" during a pull-in of a spindle servo. On the other hand, the multiplexer 60 selects the fixed value 196 and supplies it to the subtracter 56 as the edge interval reference value when the spindle servo is locked and the control signal FLOCK becomes a value "1".

The subtracter 56 as a subtracting means extracts an FSK modulation component by subtracting the edge interval reference value output from the multiplexer 60 from the count value of the register 54, and supplies the extracted value to a moving average circuit 64. The moving average circuit 64 as a first moving average means averages the values of the previous four modulation components at a timing of input of the timing signal W2 so as to provide a notch characteristic which rapidly cuts off an adjacent band (for example, 3.15 to 8 KHz) which exceeds a band (for example, 3.15 KHz) needed for a demodulation so as to eliminate a noise in the adjacent band. The averaged value is supplied to an ATC (automatic threshold control) circuit 66 as a DAT value.

Figure 9:
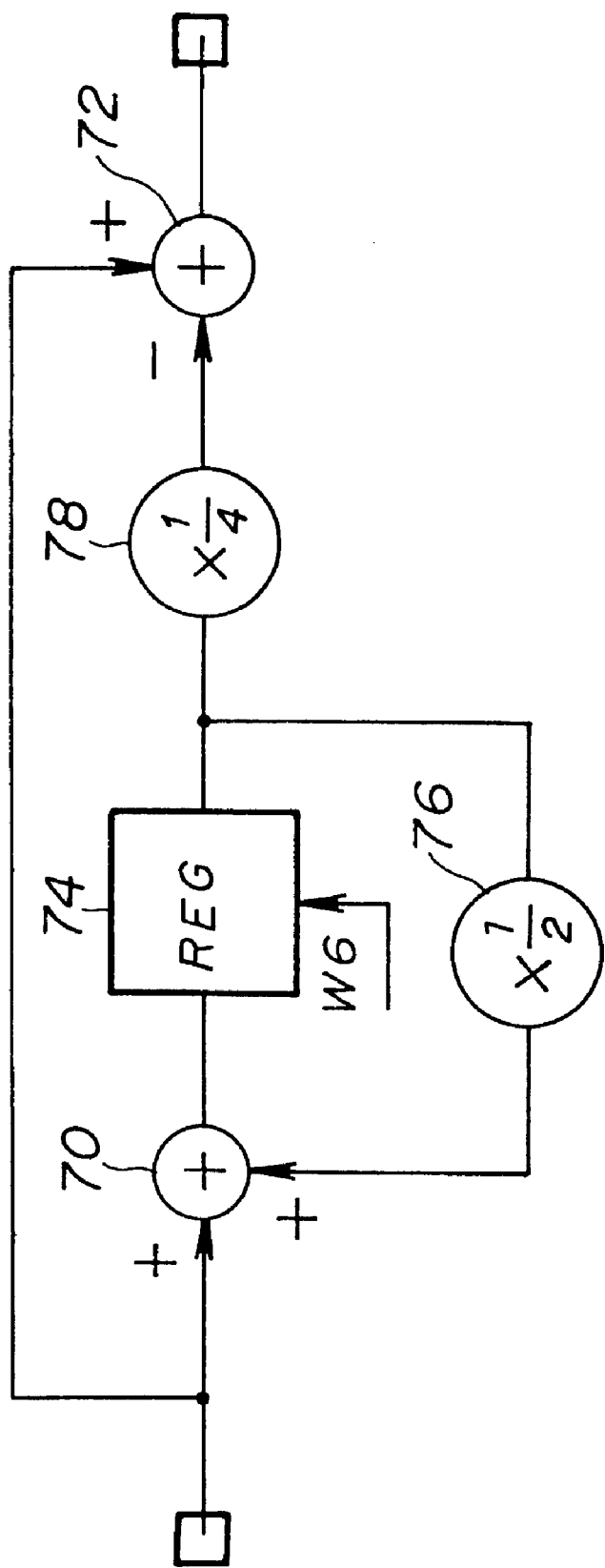
FIG. 9 is a circuit diagram of an ATC circuit.
Figure 10:
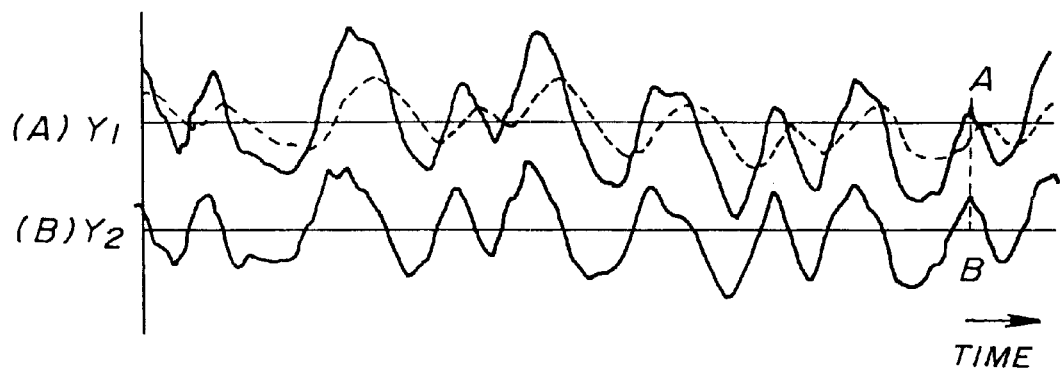
FIG. 10 is a waveform chart for explaining the present invention.

The ATC circuit 66 as a demodulation value calculating means has a structure as shown in FIG. 9, and the DAT value is supplied to an adder 70 and a subtracter 72. The adder 70 adds a value of an output value of a register 74 which value is multiplied by ½ by a multiplier 76. The added value is stored in the register 74 when the timing signal W6 is received. An output value of the register 74 is multiplied by ¼ by a multiplier 78, and is supplied to the subtracter 72 as a threshold value. In the subtracter 72, the threshold value is subtracted from the DAT value so as to obtain the demodulation value. A solid line in FIG. 10-(A) indicates the DAT value, and a dashed line indicates the threshold value. The threshold value follows the DAT value with a certain time constant. If the DAT value at a point A is discriminated by a comparator, a width of a pulse is narrow at a reference value Y1. On the contrary, a difference between the DAT value and the threshold value is as shown in FIG. 10-(B). Thus, when the difference is discriminated by the comparator, a width of the pulse gets closer to an expected value when the reference value Y2 is used. Accordingly, a capability of the FSK demodulation is increased by eliminating a low-frequency alternating component and a high-frequency noise by subtracting the threshold value which varies in response to the DAT value.

A register 80 stores the demodulation value output from the ATC circuit 66 when the timing signal W8 is received. The demodulation value DA output by the register 80 is supplied to a B terminal of a multiplexer 82 and register 84. The register 84 stores the above-mentioned demodulation value DA when the timing signal W10 is received, and supplies the demodulation signal DA as a demodulation signal DB to the terminal A of the multiplexer 82. That is, the demodulation signals DA and DB are different in their latch timing.

A flip-flop 88 is set to a value "1" at a falling edge of the timing signal W8, and is set to a value "0" at a rising edge of timing signal W10. An output signal STS of the flip-flop 88 is supplied to a flip-flop 90. The flip-flop 90 is set to a value "1" when the signal STS is raised, and is set to a value "0" when a timing signal A882 is raised.

The timing signal A882 is a signal which is synchronous with the system clock, and has a frequency of 88.2 KHz when the operation speed is a standard speed as shown in FIG. 11-(A). A timing signal B882 is slightly delayed from the timing signal A882 as shown in FIG. 11-(B). Additionally, timing signals A1764, B1764, C1764 and D1764 shown in FIG. 11-(C), (D), (E) and (F) have a frequency of 176.4 KHz when the operation speed is the standard speed, and a timing of each of the timing signals A1764, B1764, C1764 and D1764 is gradually shifted in that order.

The multiplexer 82 selects the demodulation value DA when the output of the flip-flop 90 is the value "1" so as to output the demodulation value DA to the terminal 92 as a demodulation value FLDT. On the other hand, the multiplexer 82 selects the demodulation value DB when the output of the flip-flop 90 is the value "0" so as to output the demodulation value to the terminal 92 as the demodulation value FLDT.

The demodulation value FLDT input from the terminal 94 shown in FIG. 7 is supplied to a register 96, and is stored when the timing signal B882 is received and supplied to a moving average circuit 98. The above-mentioned circuit from the register 80 to the register 96 is provided for transforming a signal synchronous with the WBL signal into a signal synchronous with the system clock. According to the timing change, an abutment of signals is prevented.

Figure 12:
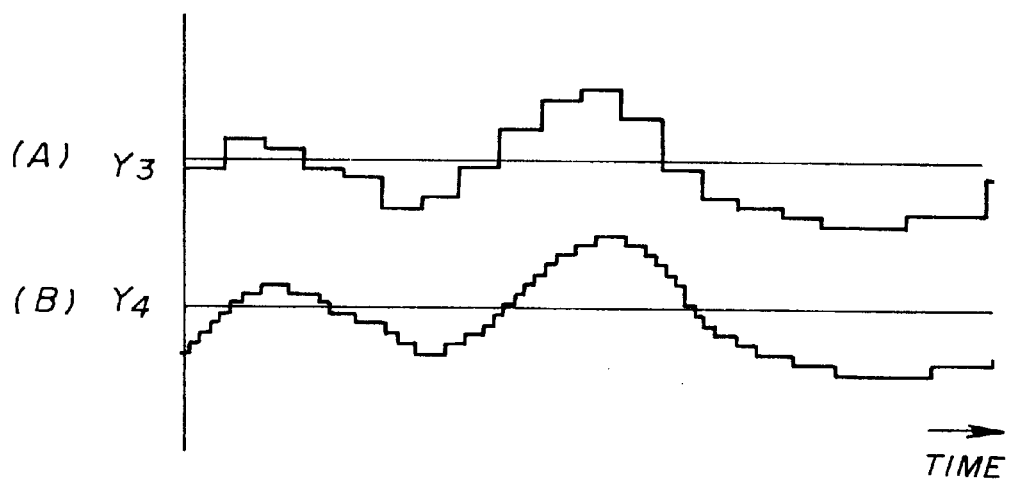
FIG. 12 is waveform chart for explaining an advantage of the present invention.

The demodulation value output from the register 96 is supplied to the moving average circuit 98. Four latest demodulation values are averaged at a timing of reception of the timing signal A882. It should be noted that the average value is doubled when the averaging is performed. The average value is supplied to a moving average circuit 100 in which the latest two values are averaged at a timing when the timing signal D1764 is received so as to eliminate a noise. The average value is supplied to a comparator 102. The moving average circuits 98 and 100 correspond to a second moving average means which performs an eight-stage averaging. The output value of the register 96 appears as shown in FIG. 12-(A), whereas the output value of the moving average circuit 100 shows a smooth change as shown in FIG. 12-(B) by being subjected to the eight-stage averaging. Thus, the resolution of an output change of the next-stage comparator 102, that is, the resolution of edges, is increased.

The comparator 102 as a comparing means receives from a hysteresis circuit 140 another reference value which corresponds to the signal BIDATA. The comparator 102 compares the average value supplied by the moving average circuit 100 with the above-mentioned reference value, and binarizes and outputs a result of the comparison. The output of the comparator 102 is latched by a flip-flop 106 at a timing of reception of the timing signal C1764, and is output from a terminal 108 as the signal BIDATA. The hysteresis circuit 104 reduces the reference value by a predetermined value $\beta$ so that the signal BIDATA next becomes the value "0" when the signal BIDATA is at the value "1" (high level). The hysteresis circuit 104 increases the reference value by the predetermined value $\beta$ so that the signal BIDATA next becomes the value "1" when the signal BIDATA is at the value "0" (low level). Accordingly, a hysteresis characteristic is provided.

As mentioned above, a noise entering the modulation component can be greatly reduced by taking the moving average of the modulation components which have been FSK demodulated. Additionally, the resolution of edges of the demodulation signal is increased by taking the moving average of the demodulation values. Thus, a circuit structure is simple.

A description will now be given of a second embodiment of the present invention.

Figure 13:
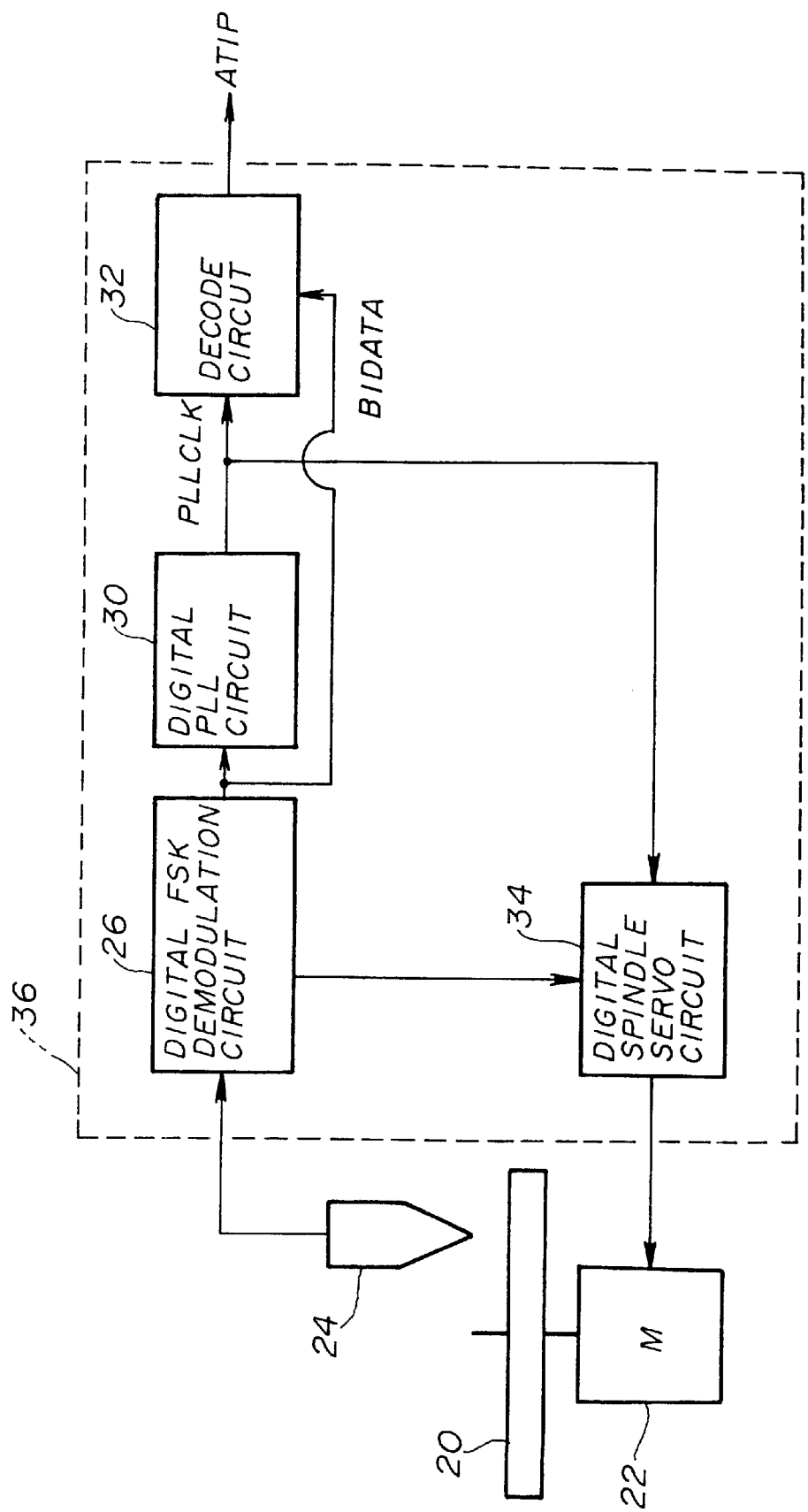
FIG. 13 is a block diagram of an optical disc apparatus according to a second embodiment of the present invention.

FIG. 13 is a block diagram of an optical disc apparatus according to the second embodiment of the present invention. In FIG. 13, parts that are the same as the parts shown in FIG. 4 are given the same reference numerals. In FIG. 13, an optical disc 20 is rotated by a spindle motor 22. An optical pickup 24 reproduces a wobble signal shown in FIG. 5-(B) from the disc 20, and binarizes the wobble signal so as to output a WBL signal shown in FIG. 5-(C). It should be noted that FIG. 5-(A) shows a modulation signal BIDATA which is used for producing the wobble signal.

The above-mentioned WBL signal is supplied to a digital FSK demodulation circuit 26 so that a demodulation signal similar to that shown in FIG. 5-(A) is demodulated.

A decode circuit 32 decodes data ATIP which is binary data by using the signal BIDATA supplied by the digital FSK demodulation circuit 26 and a clock signal PLLCLK supplied by a digital PLL circuit 30, and outputs the decoded data. The digital PLL circuit 30 produces the clock signal PLLCLK which is synchronous with the signal BIDATA supplied by the digital FSK demodulation circuit. The clock signal PLLCLK produced by the digital PLL circuit 30 is supplied to the decode circuit 32 and a digital spindle servo circuit 34. The digital spindle servo circuit 34 controls rotation of the spindle motor based on the clock signal PLLCLK and the synchronization signal supplied by the digital FSK demodulation circuit 26 so that the linear velocity of the optical disc 20 is maintained constant.

All the digital FSK demodulation circuit 26, the digital PLL circuit 30, the decode circuit 32 and the digital spindle servo circuit 34 perform digital processing, and are integrated into a semiconductor chip 36.

Figure 14:
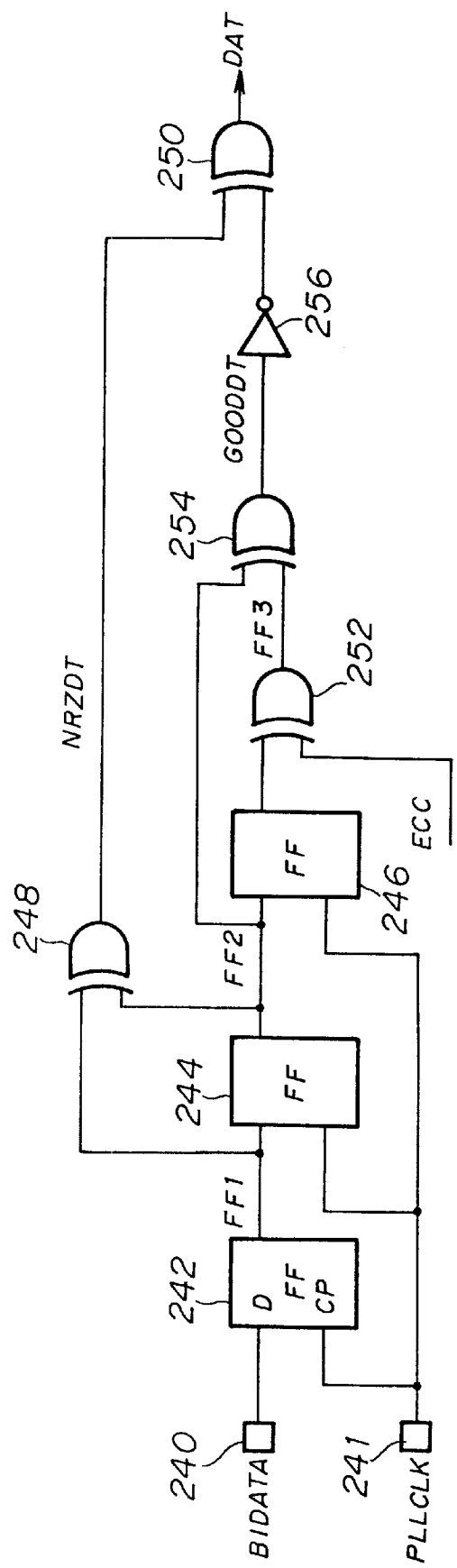
FIG. 14 is a circuit diagram of a part of a. decode circuit shown in FIG. 13.
Figure 15:
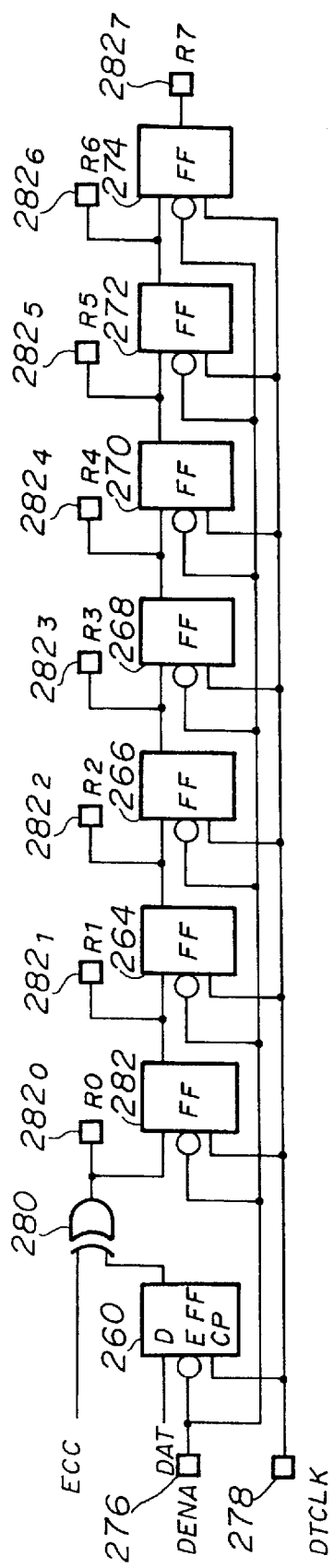
FIG. 15 is a circuit diagram of a part of the decode circuit shown in FIG. 13.
Figure 16:
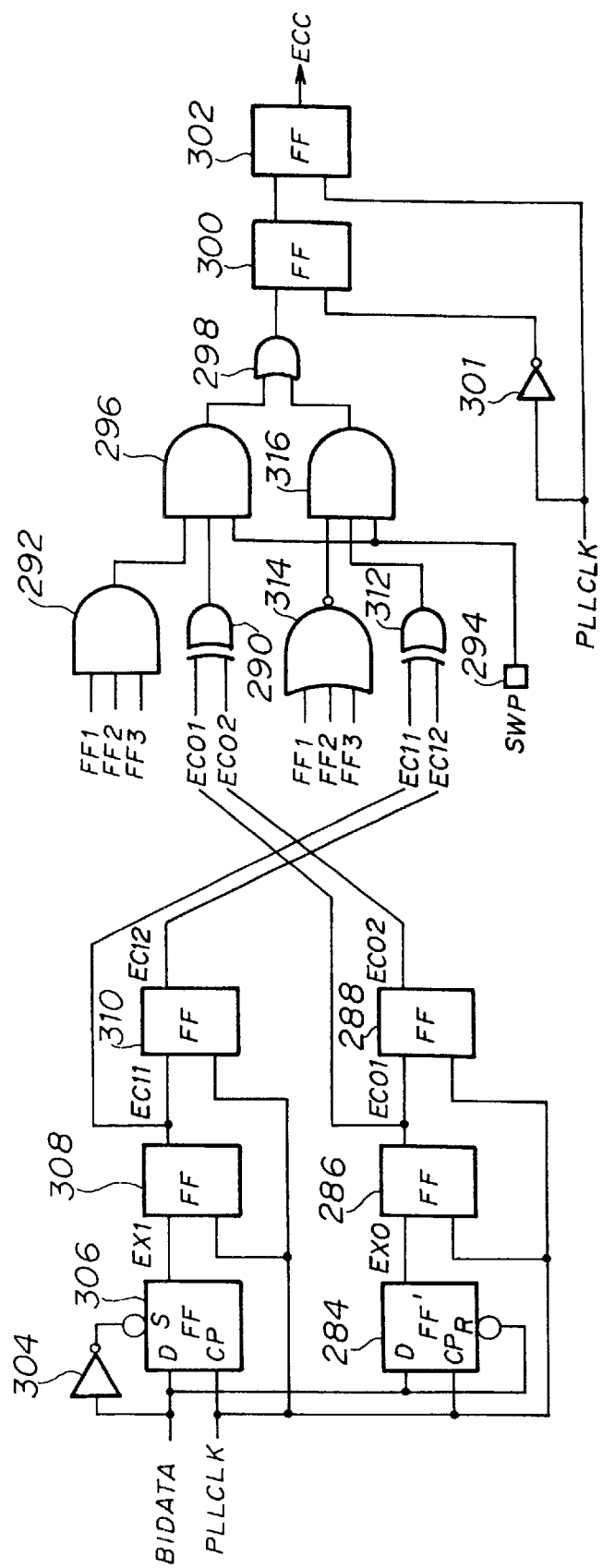
FIG. 16 is a circuit diagram of a part of the decode circuit shown in FIG. 13.

FIGS. 14 to 16 are block diagrams of the decode circuit 32. In FIG. 14, the signal BIDATA shown in FIG. 17-(A) is input to a terminal 240, and the clock signal PLLCLK shown in FIG. 17-(B) is input to a terminal 241. The signal BIDATA is always inverted at an end of each bit. When a value of the bit is "1", the signal BIDATA is inverted at a middle position of the bit, and when the value of the bit is "0", the signal BIDATA is not inverted at a middle position of the bit. Falling edges of the clock signal PLLCLK are synchronous with a middle position of a bit of the signal BIDATA and an end of each bit. It should be noted that the signal BIDATA shown in FIG. 17-(A) represents the ATIP data "11001010".

Figure 17:
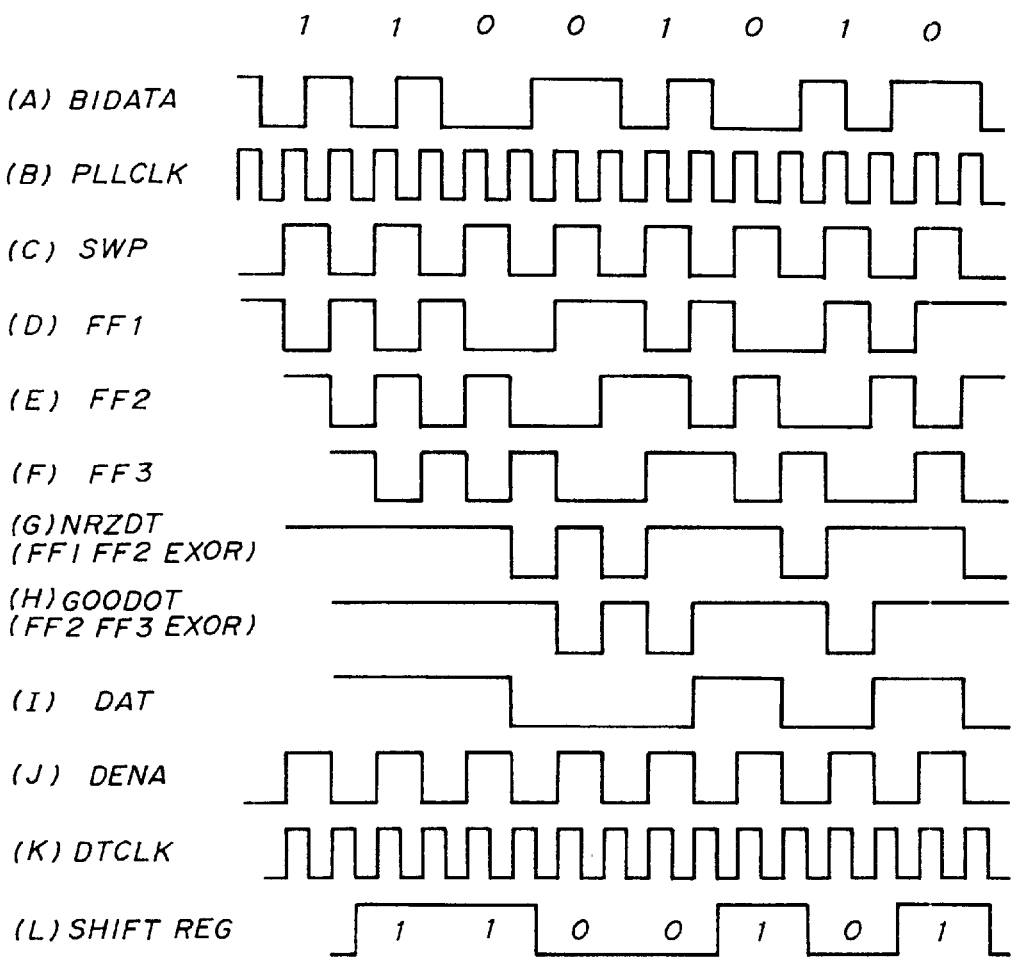
FIG. 17 is a waveform chart for explaining an operation of the second embodiment.

A D-type flip-flop 242 shown in FIG. 14 latches the signal BIDATA from the terminal 240 by rising edges of the clock signal PLLCLK from the terminal 241, and generates a signal FF1 shown in FIG. 17-(D). Additionally, a D-type flip-flop 244 latches the signal FF1 by rising edges of the clock signal PLLCLK, and generates a signal FF2 shown in FIG. 17-(E). Further, a D-type flip-flop 246 latches the signal FF2 by rising edges of the clock signal PLLCLK, and supplies the latched signal to an exclusive OR circuit 252.

An exclusive OR circuit 248 performs an exclusive OR operation on the signals FF1 and FF2 so as to generate a signal NRZDT shown in FIG. 17-(G), and supplies it to an exclusive OR circuit 250. Additionally, the exclusive OR circuit 252 performs an exclusive OR operation on an output signal of the flip-flop circuit 246 and a signal ECC (describe later) so as to output a signal FF3 shown in FIG. 17-(F). The signal FF3 is generated by inverting the output signal of the flip-flop circuit 246 when the signal ECC has a value "1", and not inverting when the signal ECC has a value "0". It should be noted that the signal ECC normally has the value "0". An exclusive OR circuit 254 performs an exclusive OR operation on the signal FF2 and the signal FF3 output from the exclusive OR circuit 252 so as to generates a signal GOODDT shown in FIG. 17-(H). The signal GOODDT is inverted by an inverter 256, and is supplied to the exclusive OR circuit 250. The inverted signal GOODDT is subjected to an exclusive OR operation with the signal NRZDT so that a signal DAT shown in FIG. 17-(I) is generated.

The signal BIDATA is inverted at a middle position of each bit representing the value "1", and is not inverted at a middle position of each bit representing the value "0". Accordingly, the data ATIP can be decoded from the signal NRZDT which is a result of an exclusive OR operation of the signals FF1 and FF2. An end of each bit of the signal BIDATA can be recognized by detecting a synchronization signal ($ATIP_{SYC}$). A rising edge of each of the clock signals SWP and DENA shown in FIG. 17-(C) and (J) represents an end of each bit which is synchronous with the clock signal PLLCLK. Accordingly, a value of the signal NRZDT while the signal DENA is at the value "0" corresponds to the data ATIP.

Additionally, since the signal BIDATA is always inverted at an end of each bit, it can be considered that an end of each bit is shifted forward or backward when the data BIDATA is not inverted. Such a shift is detected by the signal GOODDT which is a result of an exclusive OR operation of the signals FF2 and FF3. If a value of the signal GOODDT is "1" while a value of the clock signal SWP is "0", the signal BIDATA signal is inverted at an end of the corresponding bit. At this time, it is regarded that there is no violation. If a value of the signal GOODDT is "0" while a value of the clock signal SWP is "0", the signal BIDATA signal is not inverted at an end of the corresponding bit. At this time, it is regarded that there is a violation, and the data ATIP immediately before or after the corresponding bit is corrected.

The exclusive OR circuit 250 shown in FIG. 14 is provided for correcting the data ATIP immediately after the end of the corresponding bit when there is a violation. The exclusive Or circuit 250 generates the signal DAT by inverting the signal NRZDT when a value of the signal GOODDT is "1". The signal DAT is supplied to a D-type flip-flop 260 shown in FIG. 15. The D-type flip-flops 260 to 274 constitute a shift register which stores the decoded data ATIP. The shift register is enabled when the value of the clock signal DENA input from a terminal 276 is "0" so as to shift (latch) at a rising edge of the clock signal DTCLK shown in FIG. 17-(K) input from a terminal 278. Thus, output data R0 to R7 of the flip-flops 260–274 are output from respective terminals $282_0$ to $282_7$.

The output of the flip-flop 260 is supplied to an exclusive OR circuit 280. In the exclusive OR circuit 280, the output of the flip-flop 260 is inverted when the value of the signal ECC is "1", is supplied to the flip-flop 262 and the terminal $282_0$. This is to correct the data ATIP immediately before an end of the bit. It should be noted that although FIG. 15 shows the register for storing the data ATIP, a register storing the data ATIP and the 38-bit CRC data in a CRC circuit may use the above-mentioned exclusive OR circuit 280.

In FIG. 16, a D-type flip-flop 284 generates a signal EX0 by increasing an output when a value of the signal BIDATA is "1" at a rising of the clock signal PLLCLK and decreasing the output at a falling edge of the signal BIDATA. A D-type flip-flop 286 generates a signal EC01 by latching the signal EX0 by the clock signal PLLCLK. A D-type flip-flop 288 generates a signal EC02 by latching the signal EC01 by the clock signal PLLCLK.

Figure 18:
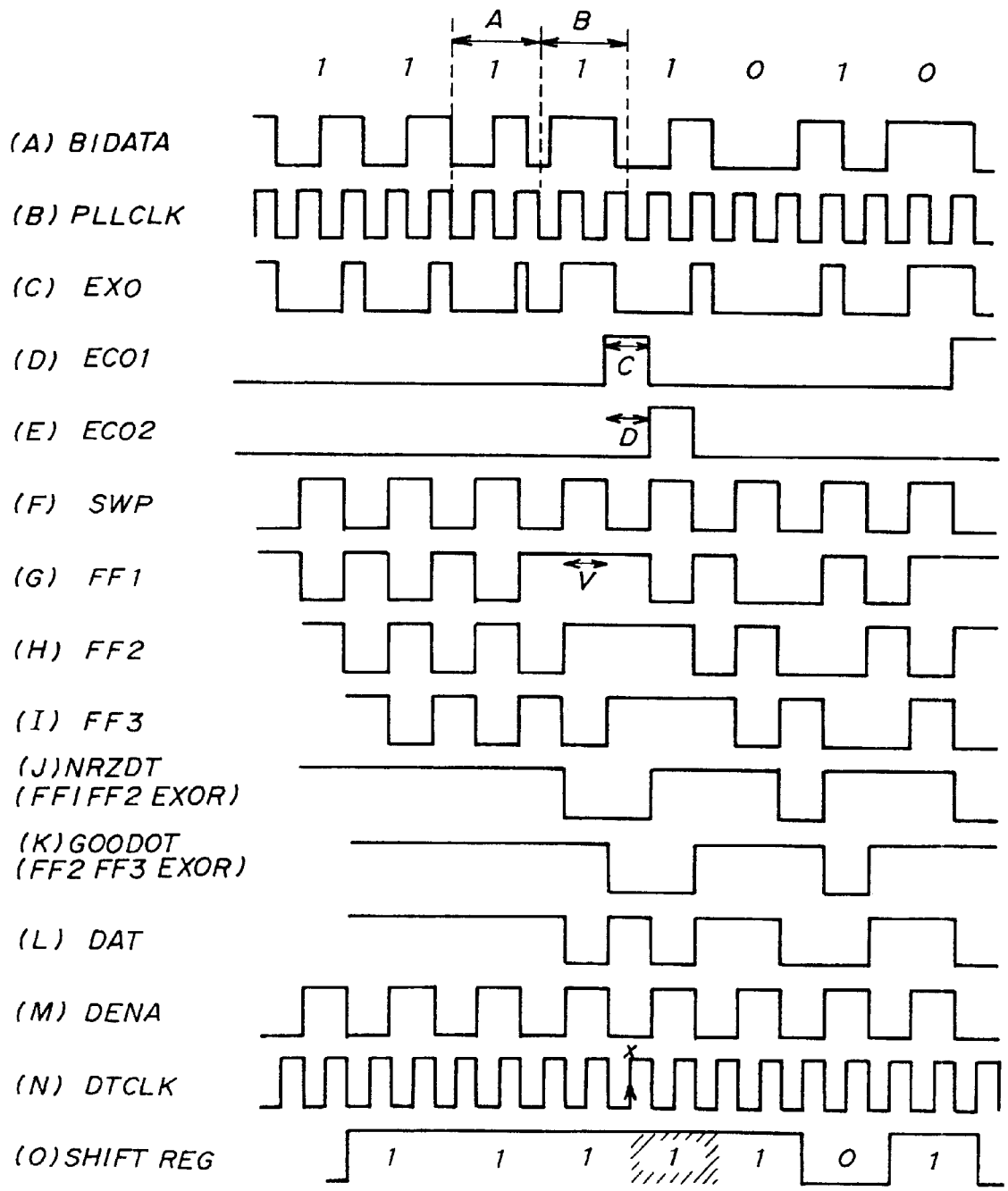
FIG. 18 is a waveform chart for explaining an operation of the second embodiment.

The signal BIDATA shown in FIG. 18-(A) has bit ranges A and B which are supposed to indicate the value "1". However, the high-level period of the bit range B is expanded due to disturbance such as a noise. In this case, the signals EX0, EC01 and EC02 shown in FIG. 18-(C), (D) and (E) are generated by using the clock signal PLLCLK shown in FIG. 18-(B). The signals EC01 and EC02 are supplied to an exclusive OR circuit 290. An output of the exclusive OR circuit 290 is supplied to an AND circuit 296. If the signals ECOL and EC02 are values "1" and "0", respectively, in respective periods C and D, this indicates that the value "1" is present in the signal BIDATA in the bit ranges A and B.

An AND circuit 292 performs an AND operation on the signals FF1, FF2 and FF3 shown in FIG. 18-(G), (H) and (I). If the output of the AND circuit 292 is the value "1", this indicates that the period of the signal BIDATA during which a value thereof is "1" continues for 1.5 periods of the clock signal PLLCLK, which is a violation period. Actually, the value "0" is expected for the signal FF1 during a period V shown in FIG. 18-(G). Additionally, an output of the exclusive OR circuit 290 during the violation period indicates that data (of the current cycle) immediately after an end of a bit when the value is "0" should be corrected. The output of the exclusive OR circuit 290 during the violation period indicates that data (of the immediately preceding cycle) immediately before an end of a bit when the value is "1" should be corrected. Accordingly, the AND circuit 296 outputs a signal having the value "1" as is in a normal operation when data immediately after an end of a bit during the violation period is corrected by performing an AND operation on the output of the AND circuit 292, the output of the exclusive OR circuit 290 and a clock signal SWP shown in FIG. 18-(F). The output of the AND circuit 296 is supplied to a D-type flip-flop 300 via an OR circuit 298 so that the output is latched by a rising time of a signal which is obtained by inverting the clock signal PLLCLK by an inverter 301. The output is also latched by a rising time of the clock signal PLLCLK by a D-type flip-flop 302. The latched signal is supplied to each of the exclusive OR circuits 252 and 280 as the signal ECC for instructing a correction when a value thereof is "0".

The exclusive OR circuit 252 is provided with the signal ECC having the value "0" when data immediately after an end of a bit during the violation period is corrected. Thus, the exclusive OR circuit 252 passes the output of the flip-flop 246 without inversion. The signal GOODDT, shown in FIG. 18-(K), output from the exclusive OR circuit 254 is inverted by the inverter 256. The exclusive OR circuit 250 generates the DAT signal shown in FIG. 18-(L) by inverting the signal NRZDT shown in FIG. 18-(J). The signal DAT is latched by a rising time of a clock signal DTCLK shown in FIG. 18-(N) during a period in which the clock signal DENA shown in FIG. 18-(M) is at the value "0". FIG. 18-(O) shows data latched by the flip-flop, and a value in a hatched area has been corrected to the value "1".

In FIG. 16, a D-type flip-flop 306 which is provided with an inverter 304, generates a signal EX1 by increasing an output at a rising edge of the data BIDATA and decreasing the output at a falling edge of the clock signal PLLCLK when the signal BIDATA is at the value "1". A D-type flip-flop 308 generates a signal EC11 by latching the signal EX1 by the clock signal PLLCLK. A D-type flip-flop 310 generates a signal EC12 by latching the signal EC11 by the clock signal PLLCLK.

Figure 19:
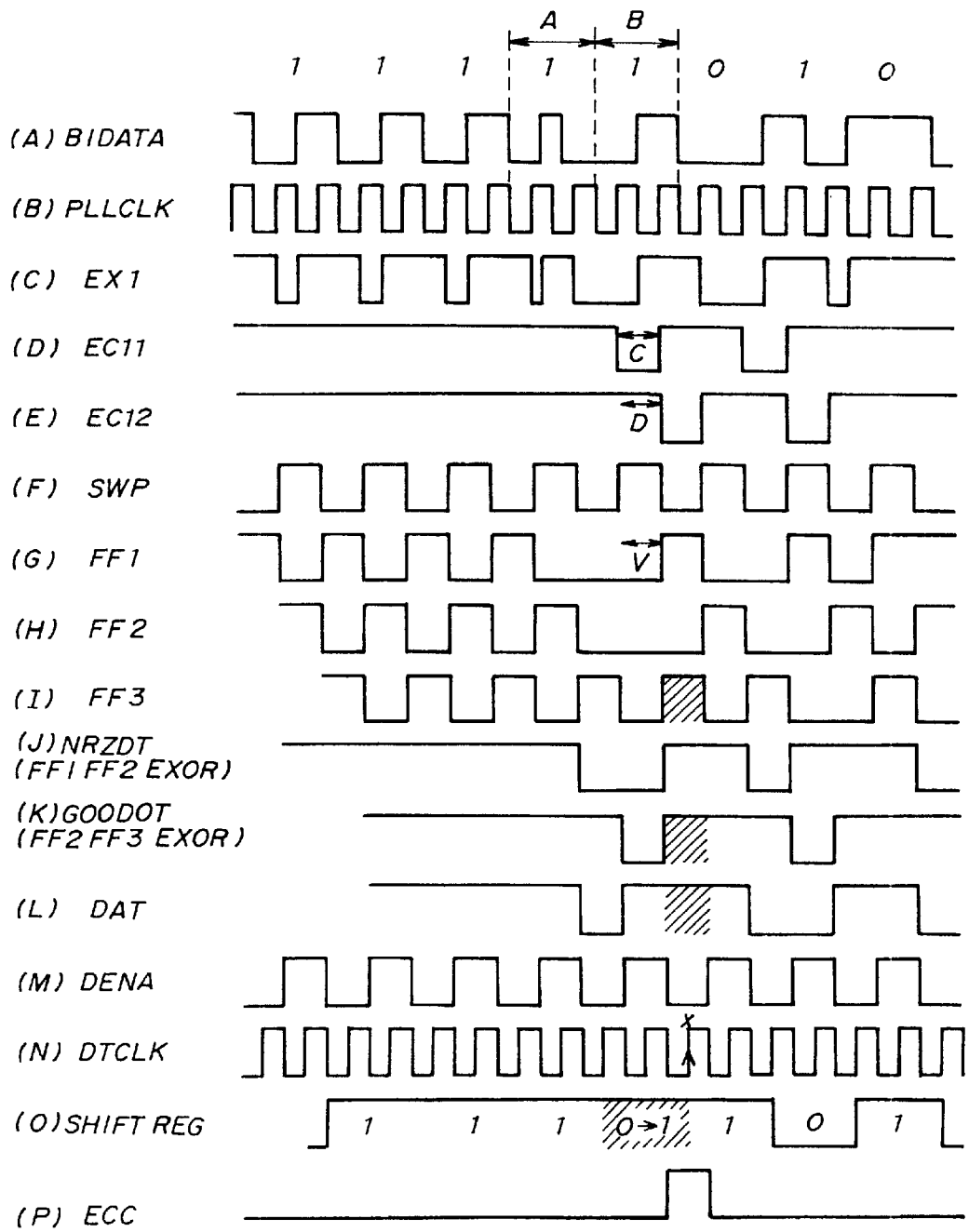
FIG. 19 is a waveform chart for explaining an operation of the second embodiment.

The signal BIDATA shown in FIG. 19-(A) has bit ranges A and B which are supposed to indicate the value "1". However, the low-level period of the bit range A is expanded due to disturbance such as a noise. In this case, the signals EX1, EC11 and EC12 shown in FIG. 19-(C), (D) and (E) are generated by using the clock signal PLLCLK shown in FIG. 19-(B). The signals EC11 and EC12 are supplied to an exclusive OR circuit 312. An output of the exclusive OR circuit 312 is supplied to an AND circuit 316. If the signals EC11 and EC12 are values "0" and "1", respectively, in respective periods C and D, this indicates that the value "1" is present in the signal BIDATA in the bit ranges A and B.

A NOR circuit 314 performs a NOR operation on the signals FF1, FF2 and FF3 shown in FIG. 19-(G), (H) and (I). If an output of the NOR circuit 314 is the value "1", this indicates that the period of the signal BIDATA during which a value thereof is "1" continues for 1.5 periods of the clock signal PLLCLK, which is a violation period. Actually, the value "1" is expected for the signal FF1 during a period V shown in FIG. 19-(G). Additionally, an output of the exclusive OR circuit 312 during the violation period indicates that data (of the current cycle) immediately after an end of a bit when the value is "0" should be corrected. The output of the exclusive OR circuit 290 during the violation period indicates that data (of the immediately preceding cycle) immediately before an end of a bit when the value is "1" should be corrected. Accordingly, the AND circuit 116 outputs a signal having the value "1" when data immediately before an end of a bit during the violation period is corrected by performing an AND operation on the output of the NOR circuit 314, the output of the exclusive OR circuit 112 and the clock signal SWP shown in FIG. 19-(F). The output of the AND circuit 316 is supplied to the D-type flip-flop 300 via the OR circuit 298 so that the output is latched by a rising time of the signal which is obtained by inverting the clock signal PLLCLK by the inverter 301. The output is also latched by a rising time of the clock signal PLLCLK by the D-type flip-flop 302. The latched signal is supplied to each of the exclusive OR circuits 252 and 280 as the signal ECC shown in FIG. 19-(P) for instructing a correction when a value thereof is "1".

The exclusive OR circuit 252 is provided with the signal ECC having the value "1" when data (old cycle) immediately before an end of a bit during the violation period is corrected. Thus, the exclusive OR circuit 252 inverts a hatched area of the signal FF3 shown in FIG. 19-(I). Additionally, a hatched area of the signal GOODDT, shown in FIG. 19-(K), output from the exclusive OR circuit 254 is turned to the value "1". Thereby, the data immediately after an end of a bit of the signal NRZDT shown in FIG. 19-(J) is not corrected by the exclusive OR circuit 250 and, thus, the signal DAT shown in FIG. 19-(L) is generated. The signal DAT is latched by the flip-flop 260 which constitutes a rising edge of the clock signal DTCLK shown in FIG. 19-(N) during a period in which the clock signal DENA shown in FIG. 19-(M) is at the value "1".

Additionally, the exclusive OR circuit 280 is provided with the signal ECC having the value "1" when data (old cycle) immediately after an end of a bit during the violation period is corrected. Thus, the exclusive OR circuit 280 corrects a hatched area of an output signal of the flip-flop 260 shown in FIG. 19-(O) by inverting from the value "0" to the value "1", and outputs a result to the flip-flop 262. It should be noted that an arrow X indicates a timing of the above-mentioned correction for the clock DTCLK shown in FIG. 19-(N).

In this embodiment, the circuit shown in FIG. 16 corresponds to a correction signal generating means. Additionally, the exclusive OR circuits 250, 252 and 254 and inverter 256 shown in FIG. 14 and the exclusive OR circuit 280 shown in FIG. 16 correspond to a data correcting means.

FIG. 20 shows a correction algorithm of the decode circuit 32 shown in FIGS. 14 to 16. In FIG. 20, EXOR represents an exclusive OR operation. The correction algorithm is not for completely correct an error but for increasing a probability of passage in a CRC check. However, by using the correction algorithm, an error rate of the CRC check in a practical circuit can be reduced to about one half, which achieves a noise resistive circuit.

A description will now be given of a third embodiment of the present invention.

Figure 21:
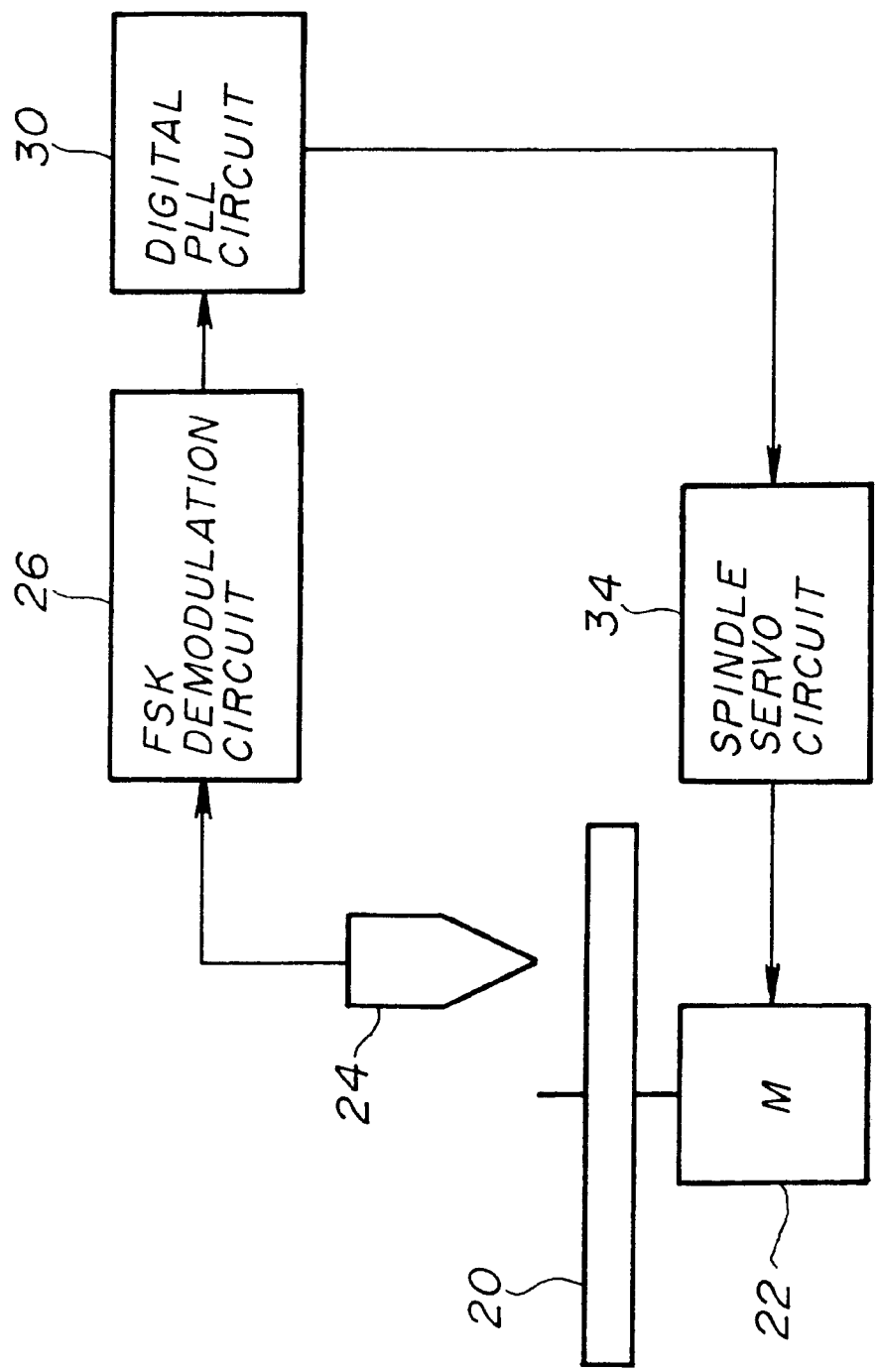
FIG. 21 is a block diagram of an optical disc apparatus according to a third embodiment of the present invention.

FIG. 21 is a block diagram of an example of a servo system of a CD-R recording system. In FIG. 21, parts that are the same as the parts shown in FIG. 4 are given the same reference numerals. In the figure, an optical disc 20 is rotated by a spindle motor 22. An optical pickup 24 reproduces a wobble signal shown in FIG. 3-(B) from the disc 20, and binarizes the wobble signal so as to output a WBL signal shown in FIG. 3-(C). It should be noted that FIG. 3-(A) shows a demodulation signal BIDATA which is used for producing the wobble signal.

Figure 1:
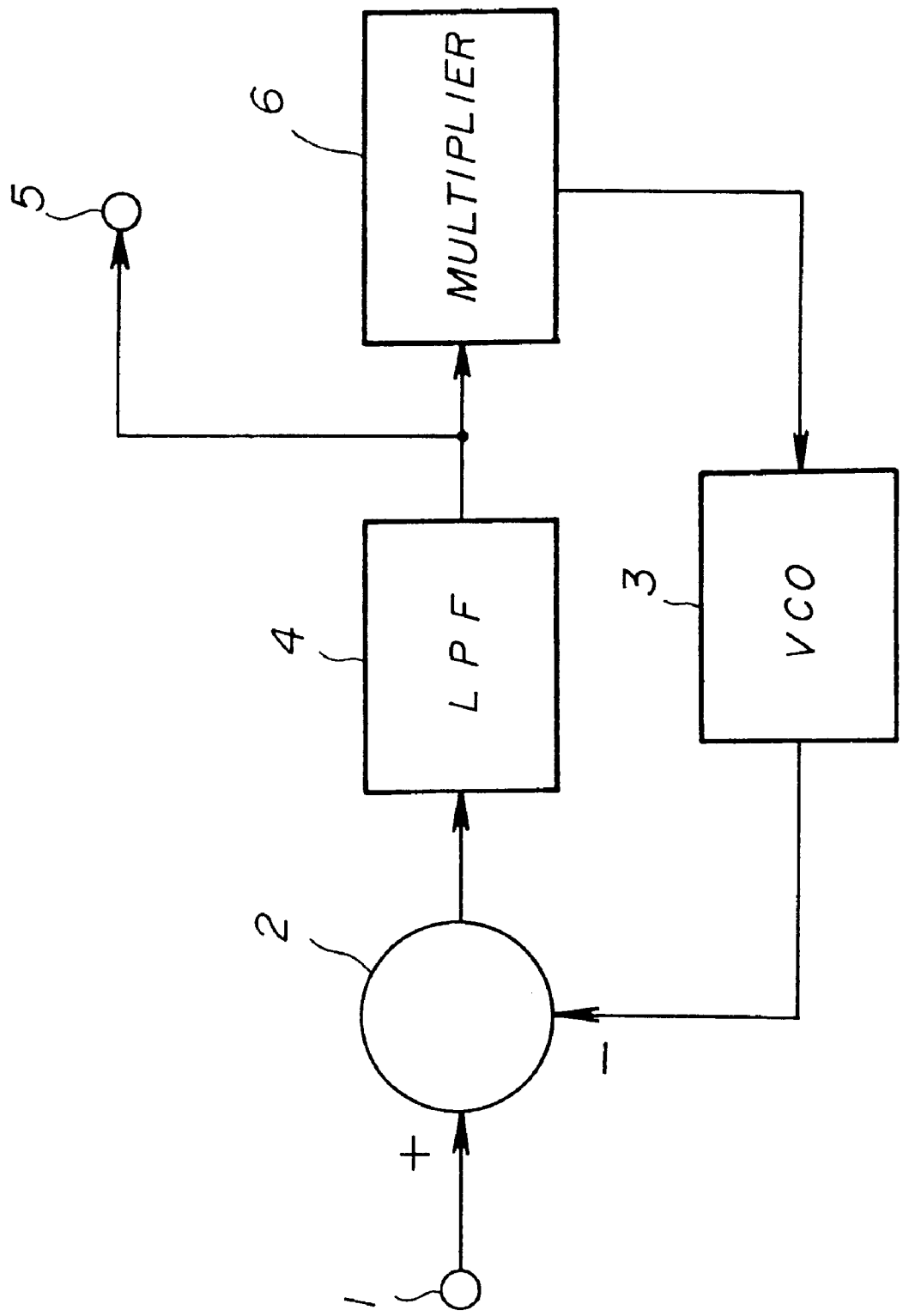
FIG. 1 is a block diagram of a conventional FSK demodulation circuit.
Figure 2:
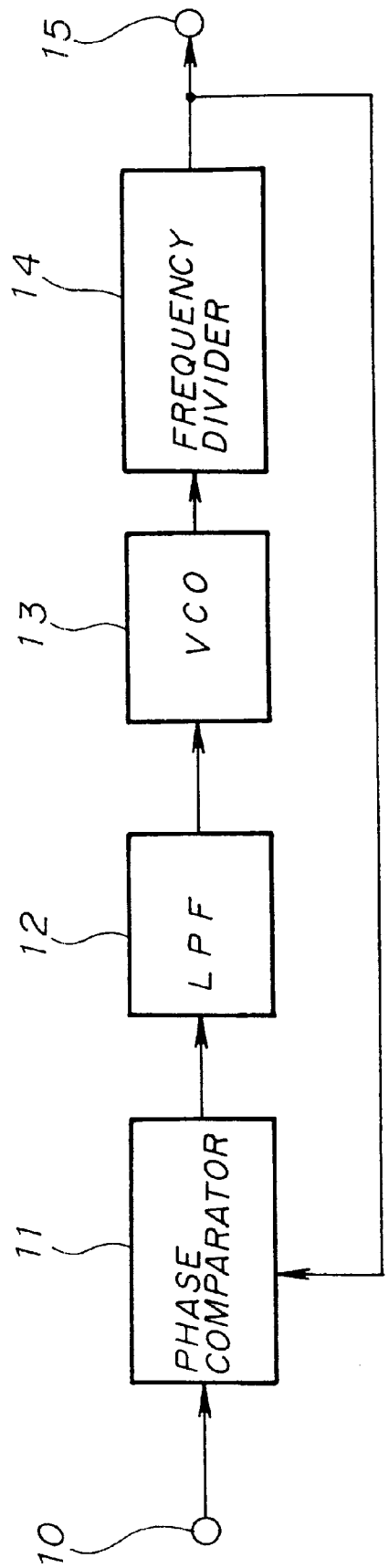
FIG. 2 is a block diagram of a conventional analog PLL circuit.
Figure 3:
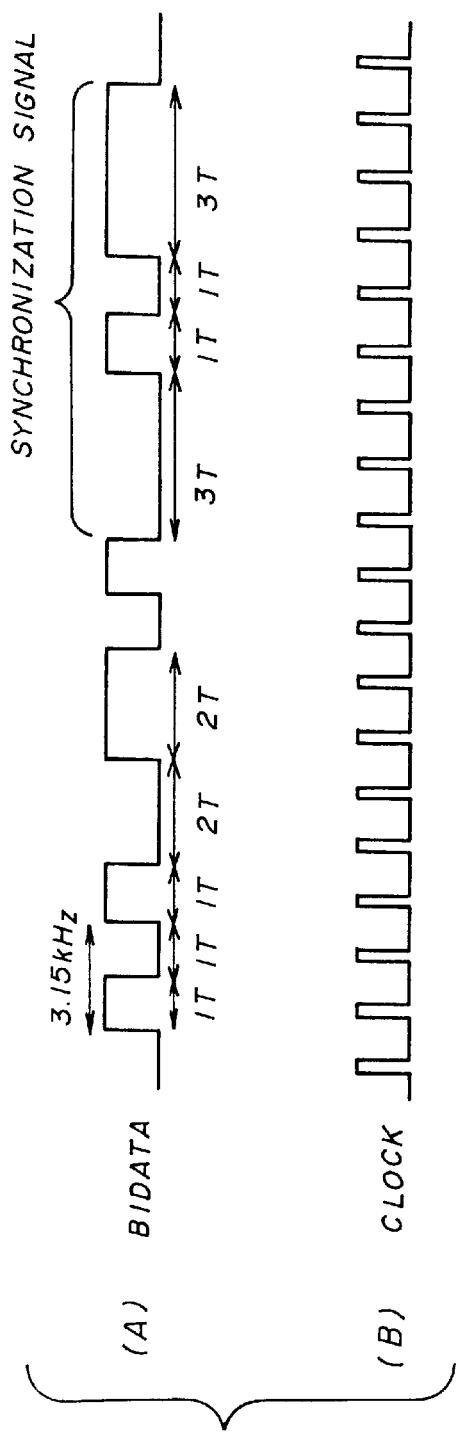
FIG. 3 is waveform charts of a signal BIDATA and a clock signal generated by the PLL circuit shown in FIG. 2.

The above-mentioned WBL signal is supplied to a digital FSK demodulation circuit 26 so that a demodulation signal similar to that shown in FIG. 3-(A) is demodulated and a synchronization signal (ATIP$_{SYC}$) is detected. A digital PLL circuit 30 produces a signal by frequency-dividing the WBL signal supplied by the digital FSK demodulation circuit 26 by 3.5. The digital PLL circuit also produces a clock signal which is synchronous with edges of the signal BIDATA. The signals produced by the digital PLL circuit 30 are supplied to a digital spindle servo circuit 34. The digital spindle servo circuit 34 controls rotation of the spindle motor based on the clock signal and the synchronization signal supplied by the digital FSK demodulation circuit 26 so that the linear velocity of the optical disc 20 is maintained constant.

Figure 22:
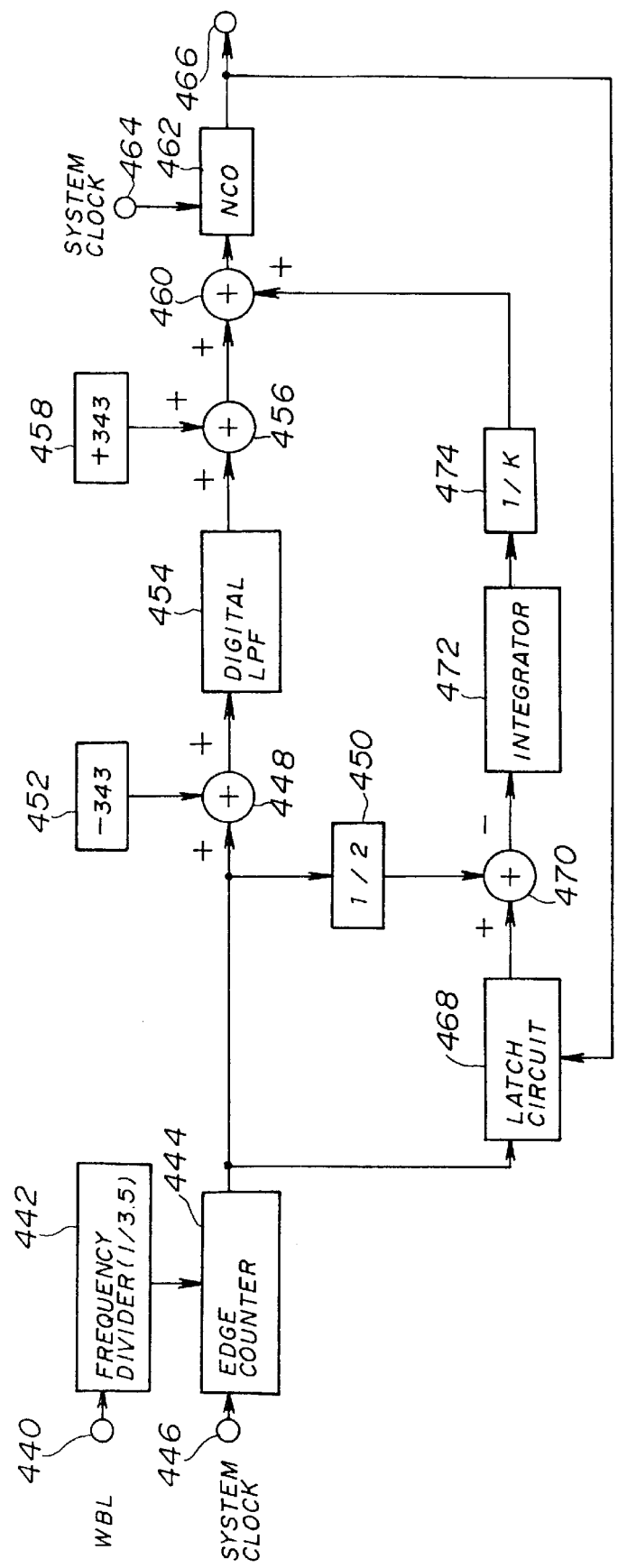
FIG. 22 is a block diagram of a digital PLL circuit shown in FIG. 21.

FIG. 22 is a block diagram of the digital PLL circuit 30 according to the present invention. In the figure, the WBL signal before demodulation is input via the FSK demodulation circuit 26. The WBL signal is supplied to a frequency divider 442 which is a frequency dividing means. The frequency divider 442 divides the WBL signal by 3.5 so as to generate a clock signal having a pulse width 1T. The clock signal is supplied to an edge counter 444. The edge counter 444 as a measuring means is reset by rising and falling edges of the clock signal which is output from the frequency divider 442. Thereafter, the edge counter 444 counts the system clock supplied from a terminal 446 so as to measure an interval of edges of the system clock.

A system clock frequency of the system clock is varied as a standard frequency, a double frequency, and afour times frequency when an operational speed of the disc 20 is varied between a standard speed, a double speed and a four-times speed. At any speed, a number of pulses at the standard frequency is 686 pulses in the pulse width 1T of the above-mentioned clock signal. Thereby, a count value of the edge counter 444 is near 686 at the standard frequency. The edge interval value which is near the output value 686 of the edge counter 444 is supplied to each of an adder 448, a multiplier 450 and a latch circuit 468.

The adder 448 adds a constant 343 supplied by a constant generator 452 to a value of 1T, and supplies a result to a digital low-pass filter 454. The digital lowpass filter 454 eliminates a sharply fluctuating component in the supplied value, and supplies the supplied value to an adder 456. The adder 456 adds a constant 343 supplied by a constant generator 458 to the supplied value so as to generate an edge interval value, and supplies the edge interval value to an adder 460. The adder 460 adds a phase error correction value to the edge interval value, and the corrected value of 1T is supplied to an NCO (numerical controlled oscillator) 462.

The NCO 462 is provided with the system clock from a terminal 464. The NCO 462 counts the system clock so as to generate a clock signal shown in FIG. 3-(B) which is raised when the count value becomes equal to the edge interval value of the adder 460, and resets the count value. The clock signal is output from a terminal 466 and supplied to the latch circuit 468. The above-mentioned adder 448 to the NCO 462 corresponds to a clock generating means.

The latch circuit 468 is provided with the count value output from the edge counter 444. The latch circuit 468 latches the count value by a rising edge of the clock signal supplied by the NCO 462, and supplies the latched signal to a subtracter 470. The subtracter 470 is provided with a reference value which is obtained by multiplying the edge interval value output from the edge counter 444 by ½ by the multiplier 450. The subtracter 470 subtracts the reference value from a value output from the latch circuit 468 so as to obtain a phase error value, and supplies the phase error value to an integrator 472.

The reason for using one half of the value 1T is to match a rising edge of the clock signal to a middle position of the pulse width 1T of the signal BIDATA. The integrator 472 performs proportional integration on the phase error value. The integrated value is multiplied by 1/K (K is an integer equal to or greater than 1) by a multiplier 474 so as to obtain a phase error corrected value, and is supplied to the adder 460. The above-mentioned multiplier 450, the latch circuit 468 to the multiplier 474 and the adder 460 correspond to a phase correcting means.

As mentioned above, in the present embodiment, the phase system formed by a path including the multiplier 450, the latch circuit 468 to the adder 470, the integrator 472 and the multiplier 474 are provided in addition to the frequency system formed by a path including the edge counter 444 to the adder 448, the digital low-pass filter 454 and the adder 448. Thereby, the clock signal is generated by the adder 460 by the frequency system and the phase system, resulting in generation of a stable clock signal which is synchronous with the WBL signal. Additionally, since the entire system of the present embodiment is structured by digital circuits, the system according to the present embodiment is more resistive to fluctuations in an ambient temperature or a power supply voltage than that constituted by analog circuits. Thus, the present embodiment can omit an externally mounted circuit when is integrated into a semiconductor device. Additionally, the operational speed of standard speed, a double speed or a four times speed can be achieved by merely changing the frequency of the system clock supplied by the terminals 446 and 464. Additionally, since the circuit of the present embodiment operates based on the count value of the edge counter 444, a good linearity is achieved and a capture range of a phase lock operation is expanded.

Additionally, since the clock pulse having the pulse width 1T is generated by dividing the frequency of the WBL signal by 3.5, the circuit of the present embodiment has a simple structure comprising only the frequency divider 442, which results in a greatly reduced circuit scale as compared to a case in which the clock pulse is generated by the signal BIDATA resulting in a large circuit scale due to a comparing circuit and a selecting circuit.

Further, the clock signal is generated from the WBL signal even during a pull-in operation in which a linear velocity of the optical disc 20 is not constant or a track jump operation in which the optical pickup 24 is moved in a radial direction of the optical disc 20. Thus, the frequency is changed in response to the linear velocity of the optical disc 20.

Accordingly, a stable spindle servo can be performed by supplying the clock signal output from the terminal 466 to the spindle servo circuit 34.

When the signal BIDATA is demodulated from the WBL signal, a Jitter is generated. Accordingly, in a conventional system, a digital low-pass filter for filtering the edge interval values is required to have a sharp cutoff characteristic. However, in the present embodiment, such a jitter for demodulation is not included since the edge interval value is calculated by using the WBL signal. Thus, a filter of a simple circuit structure having a gentle cutoff characteristic can be used for the digital low-pass filter 454.

The present invention is not limited to the specifically disclosed embodiments, and variations and modifications may be made without departing from the scope of the present invention.

The present application is based on the Japanese priority applications No. 9-140457, No. 9-165954 and No. 9170075, the contents of which are hereby incorporated by reference.

What is claimed is:

1. In an optical disc apparatus, a digital PLL circuit comprising:
   frequency dividing means for dividing a frequency of a demodulated signal reproduced from an optical disc by a predetermined dividing ratio;
   measuring means for measuring an edge interval of an output signal of said frequency dividing means; and
   clock generating means for generating and outputting a clock signal based on an edge interval value obtained by said measuring means.

2. The optical disc apparatus as claimed in claim 1, wherein said digital PLL circuit further comprises phase correction means for correcting the edge interval value measured by said measuring means by detecting a phase error from a measurement value of said measuring means obtained at a timing of the clock signal generated by said clock generating means.

* * * * *